US010135445B2

(12) United States Patent
Yamaji

(10) Patent No.: US 10,135,445 B2
(45) Date of Patent: Nov. 20, 2018

(54) SEMICONDUCTOR INTEGRATED CIRCUIT DEVICE

(71) Applicant: FUJI ELECTRIC CO., LTD., Kawasaki-shi, Kanagawa (JP)

(72) Inventor: Masaharu Yamaji, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 166 days.

(21) Appl. No.: 15/196,764

(22) Filed: Jun. 29, 2016

(65) Prior Publication Data
US 2016/0308534 A1 Oct. 20, 2016

Related U.S. Application Data

(63) Continuation of application No. PCT/JP2015/067370, filed on Jun. 16, 2015.

(30) Foreign Application Priority Data

Jul. 2, 2014 (JP) .................. 2014-137241

(51) Int. Cl.
H01L 29/02 (2006.01)
H03K 19/0185 (2006.01)
H01L 21/76 (2006.01)
H01L 27/082 (2006.01)
H01L 29/06 (2006.01)
(Continued)

(52) U.S. Cl.
CPC ..... H03K 19/018521 (2013.01); H01L 21/76 (2013.01); H01L 21/823892 (2013.01); H01L 27/082 (2013.01); H01L 27/092 (2013.01); H01L 29/0649 (2013.01); H01L 29/1095 (2013.01); H01L 29/7393 (2013.01); (Continued)

(58) Field of Classification Search
None
See application file for complete search history.

(56) References Cited

U.S. PATENT DOCUMENTS 5,894,156 A 4/1999 Terashima et al.
6,597,550 B1 7/2003 Chey et al.
(Continued)

FOREIGN PATENT DOCUMENTS

CN 103038876 A 4/2013
JP 2001-025235 A 1/2001
(Continued)

Primary Examiner — Shaun Campbell
(74) Attorney, Agent, or Firm — Rabin & Berdo, P.C.

(57) ABSTRACT

A semiconductor integrated circuit device, including a semiconductor layer of a first conductivity type, a first well region of a second conductivity type, a second well region of the second conductivity type, and a third well region of the first conductivity type. The device further includes an isolation region electrically isolating a predetermined region in the first well region, a first high-concentration region of the second conductivity type, disposed outside the isolation region and inside one of the first well region and the second well region, and a second high-concentration region of the second conductivity type, disposed inside the isolation region and inside one of the first well region and the second well region. The first and second high-concentration regions each have an impurity concentration that is higher than that of the first well region.

10 Claims, 12 Drawing Sheets

(51) Int. Cl.

| | | |
|---|---|---|
| *H01L 29/10* | (2006.01) | |
| *H01L 29/739* | (2006.01) | |
| *H03K 17/567* | (2006.01) | |
| *H01L 21/8238* | (2006.01) | |
| *H01L 27/092* | (2006.01) | |
| *H02M 7/00* | (2006.01) | |
| *H01L 29/861* | (2006.01) | |

(52) U.S. Cl.
CPC ........ *H03K 17/567* (2013.01); *H01L 27/0922* (2013.01); *H01L 29/861* (2013.01); *H02M 7/003* (2013.01)

(56) References Cited

U.S. PATENT DOCUMENTS

| | | |
|---|---|---|
| 2002/0195659 A1 | 12/2002 | Jimbo et al. |
| 2009/0085117 A1 | 4/2009 | Harada et al. |
| 2010/0283116 A1 | 11/2010 | Shimizu et al. |
| 2013/0001736 A1* | 1/2013 | Yamaji ............ H01L 21/823481 257/499 |
| 2015/0014783 A1* | 1/2015 | Imai ................ H01L 21/823878 257/372 |

FOREIGN PATENT DOCUMENTS

| | | |
|---|---|---|
| JP | 3346763 B2 | 11/2002 |
| JP | 2004-006555 A | 1/2004 |
| JP | 3917211 B2 | 5/2007 |
| JP | 2008-301160 A | 12/2008 |
| JP | 2010-263116 A | 11/2010 |
| WO | WO 2012176347 A1 | 12/2012 |
| WO | WO 2014041921 A1 | 3/2014 |

\* cited by examiner

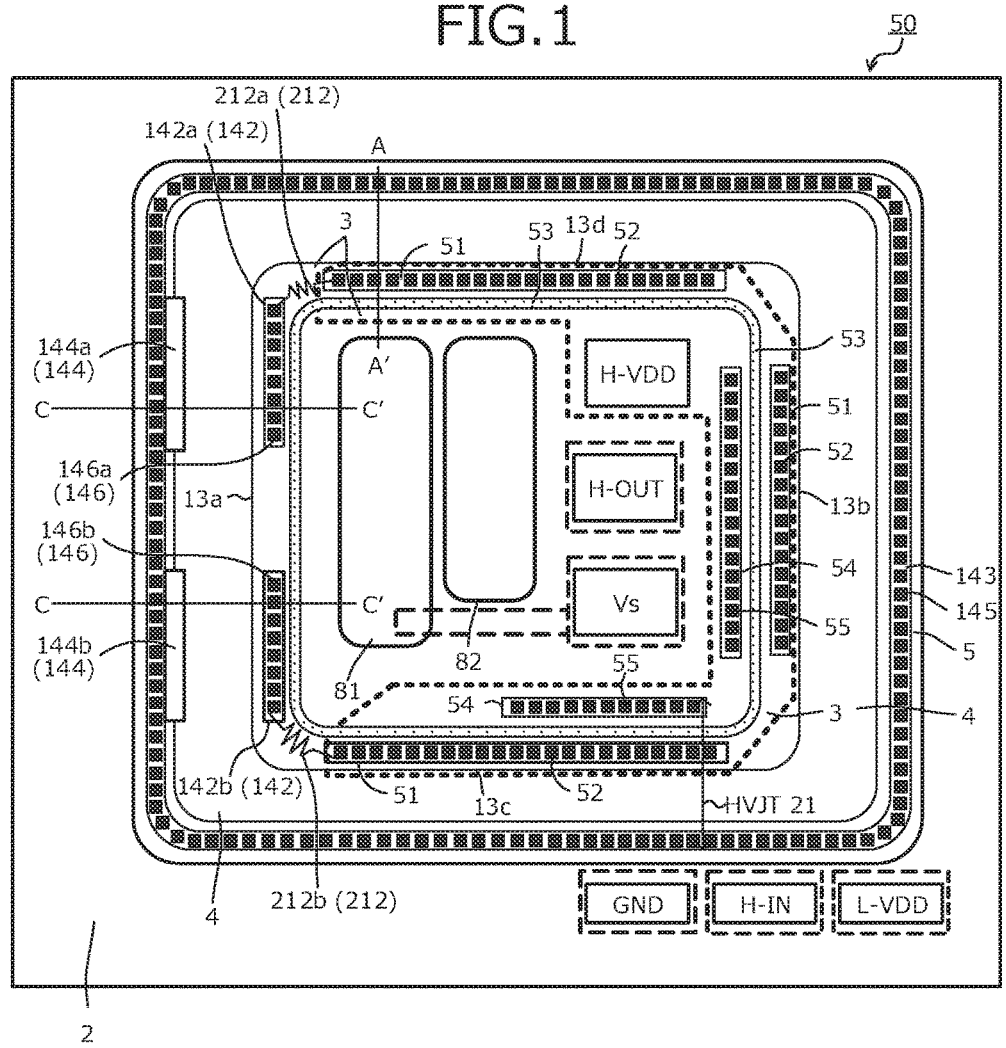

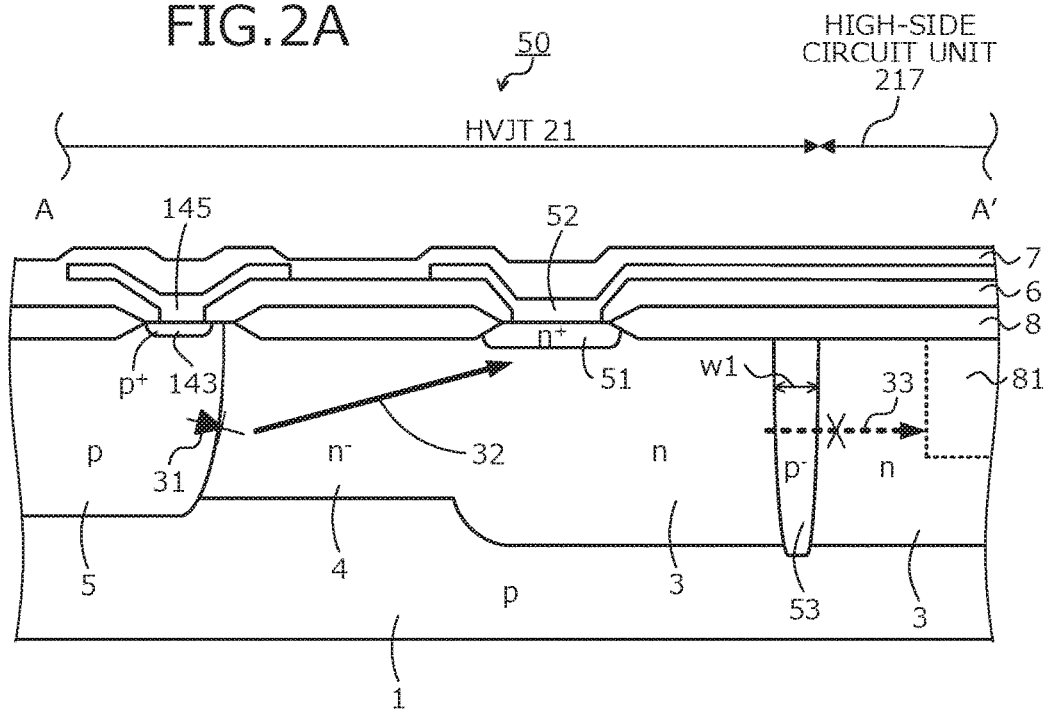
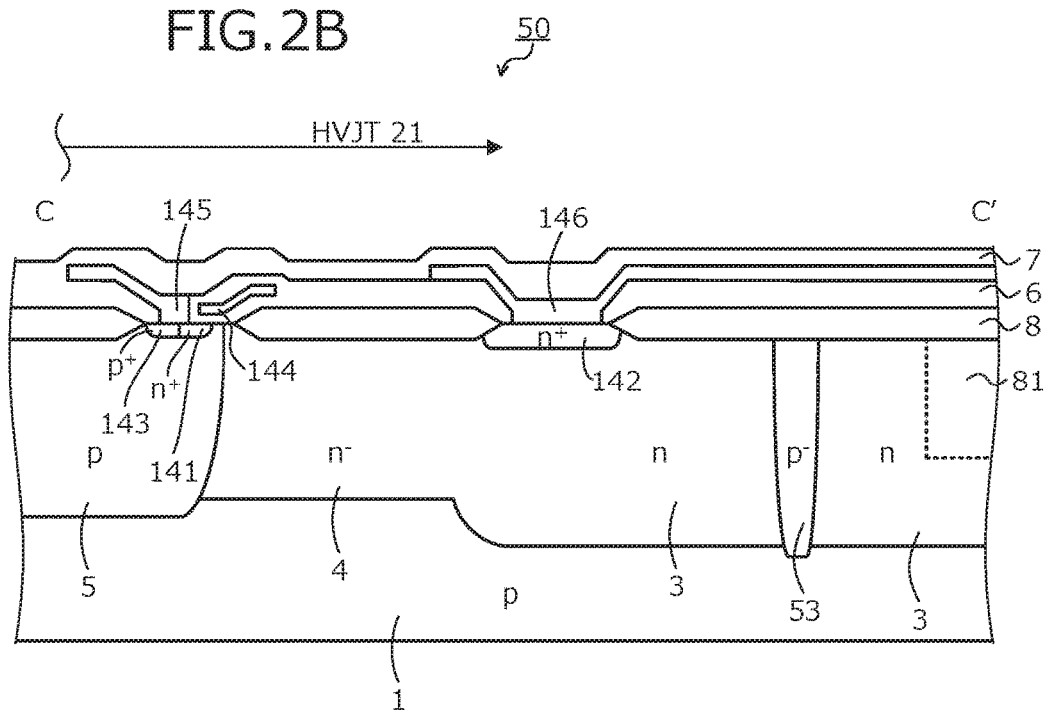

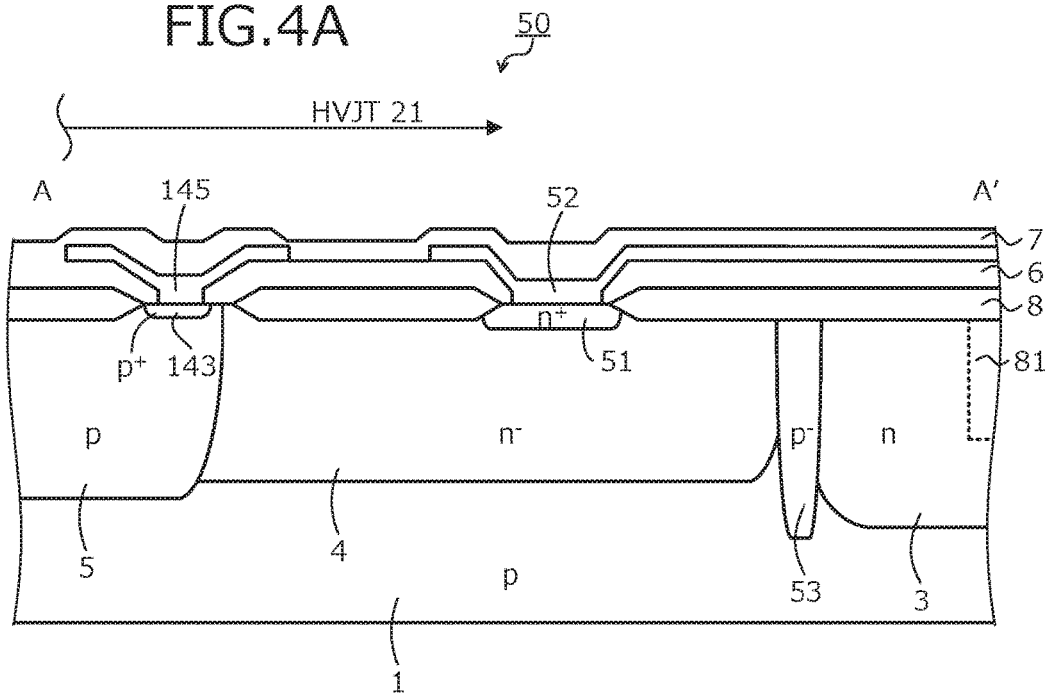
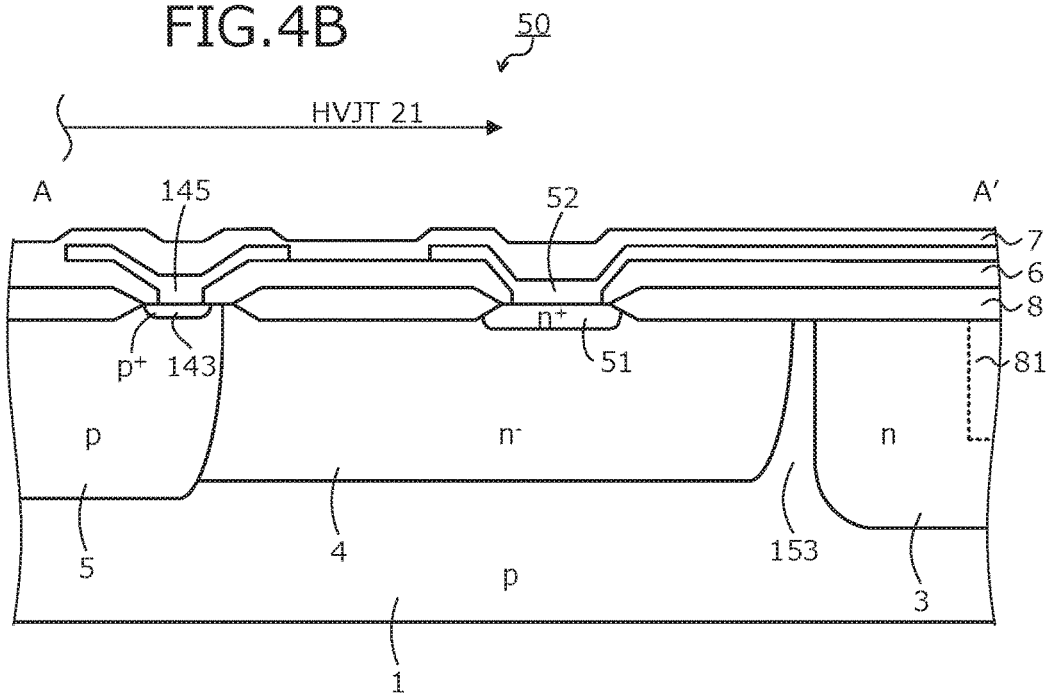

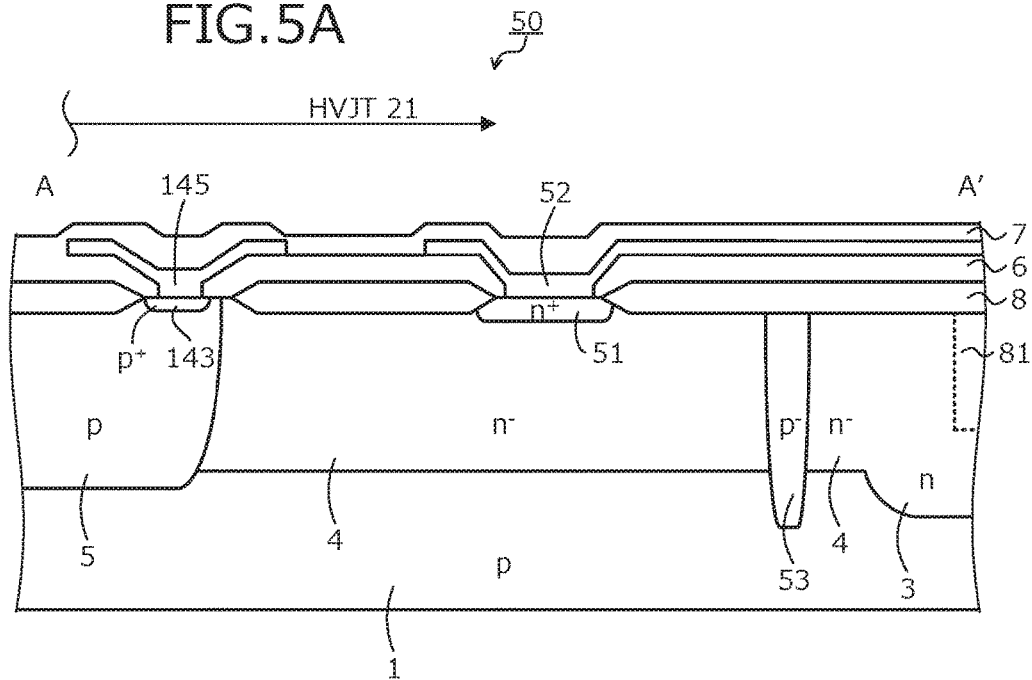
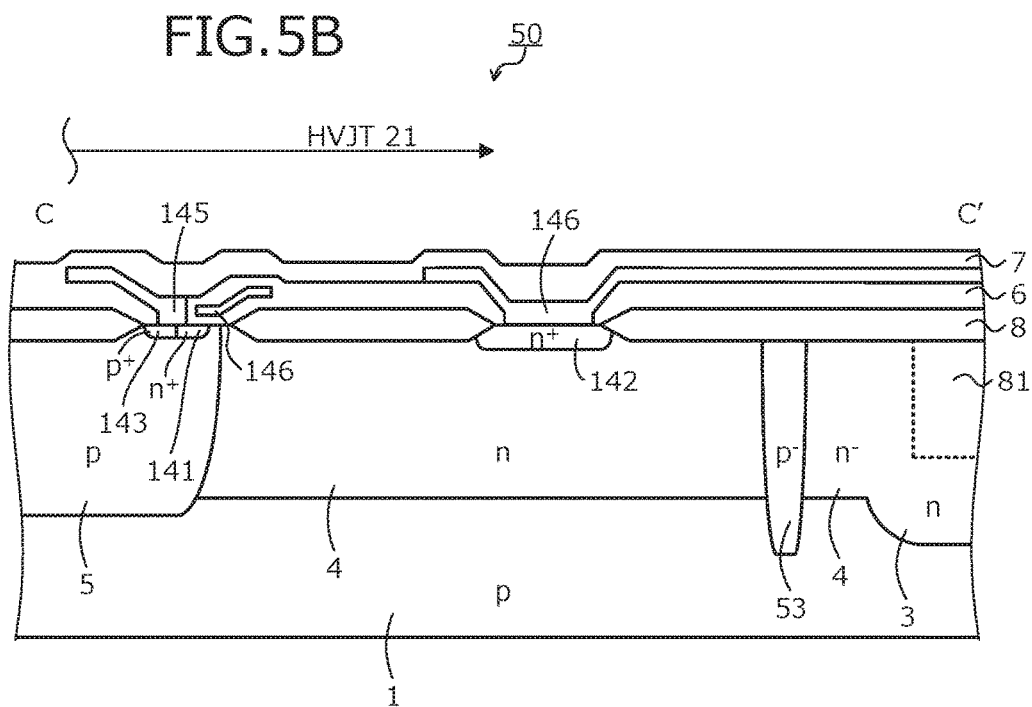

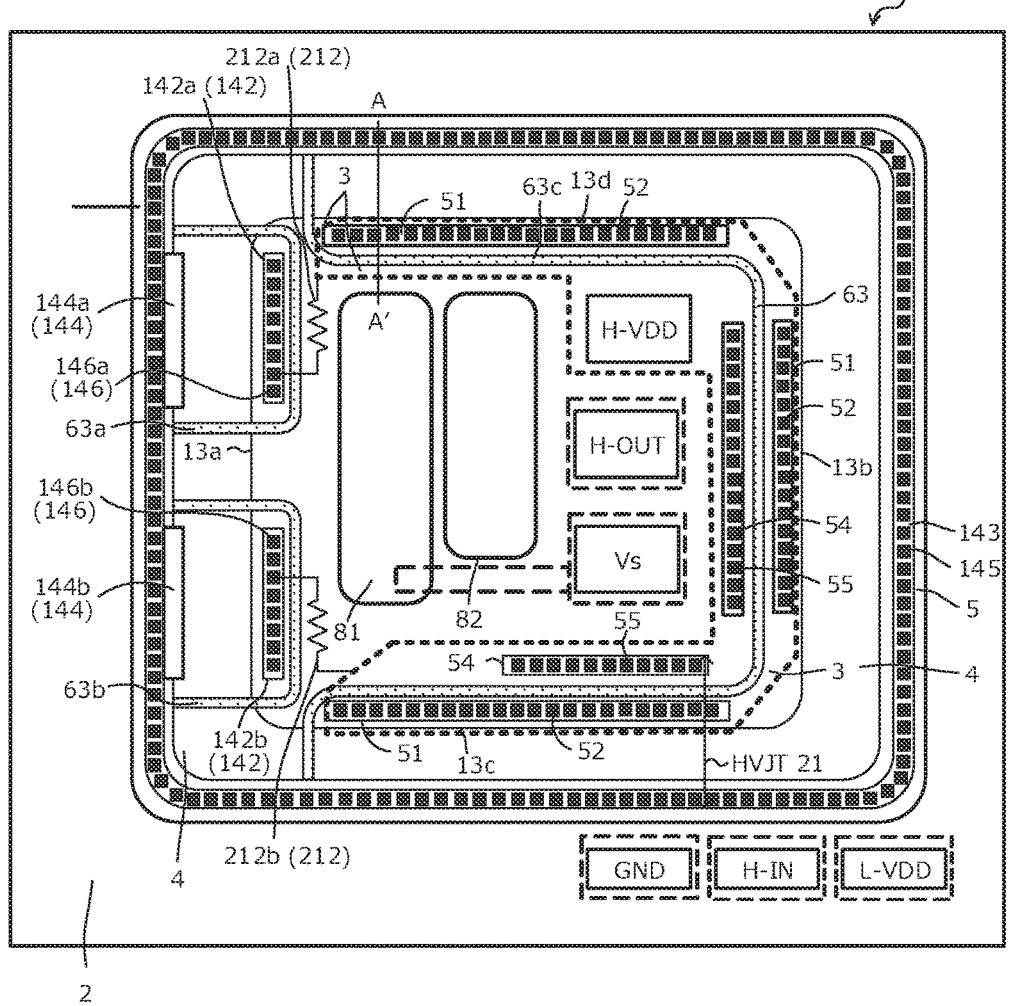

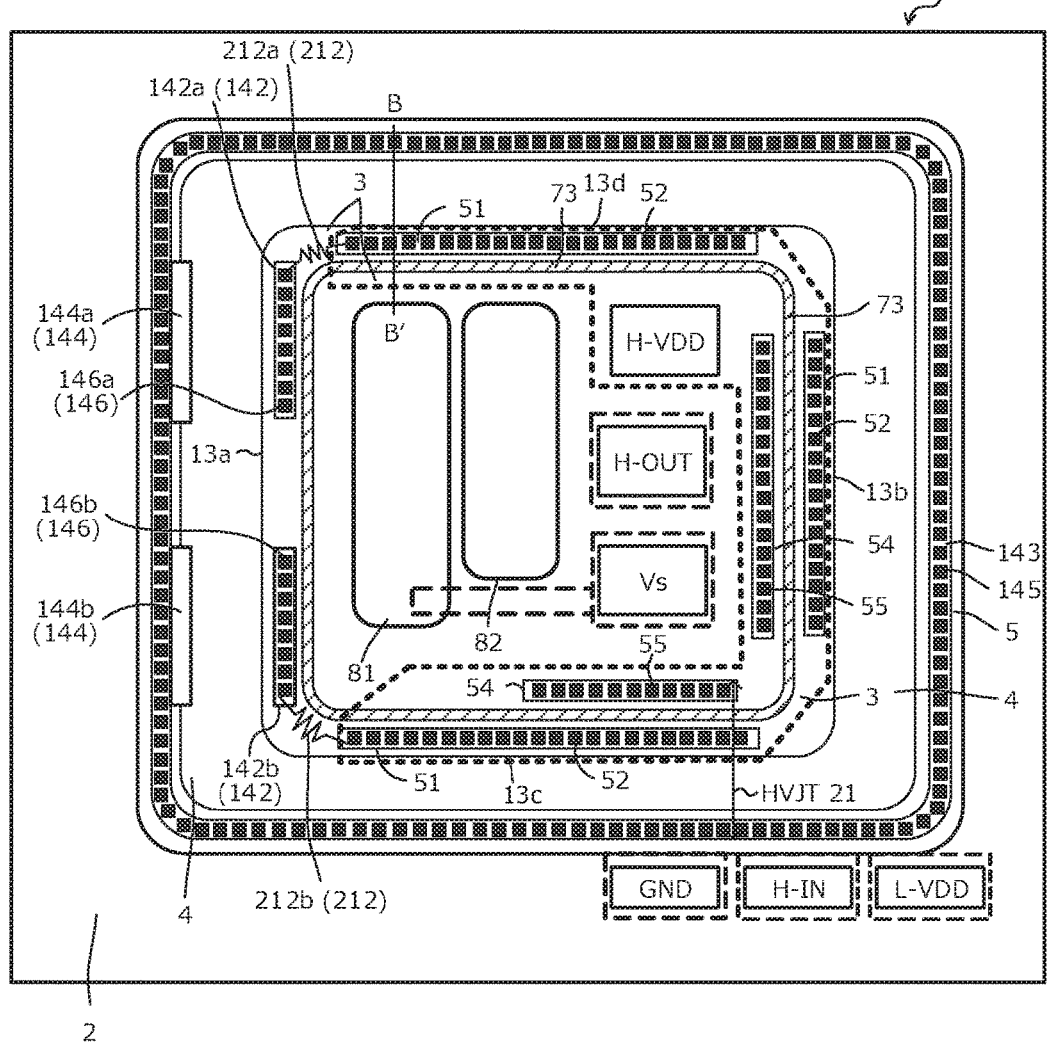

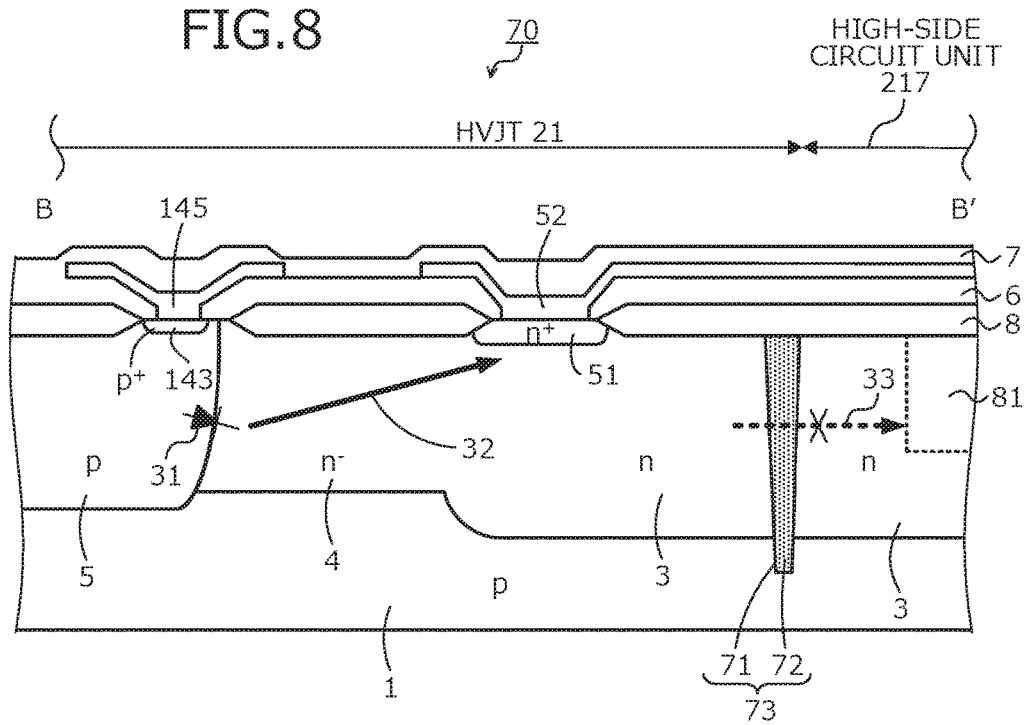
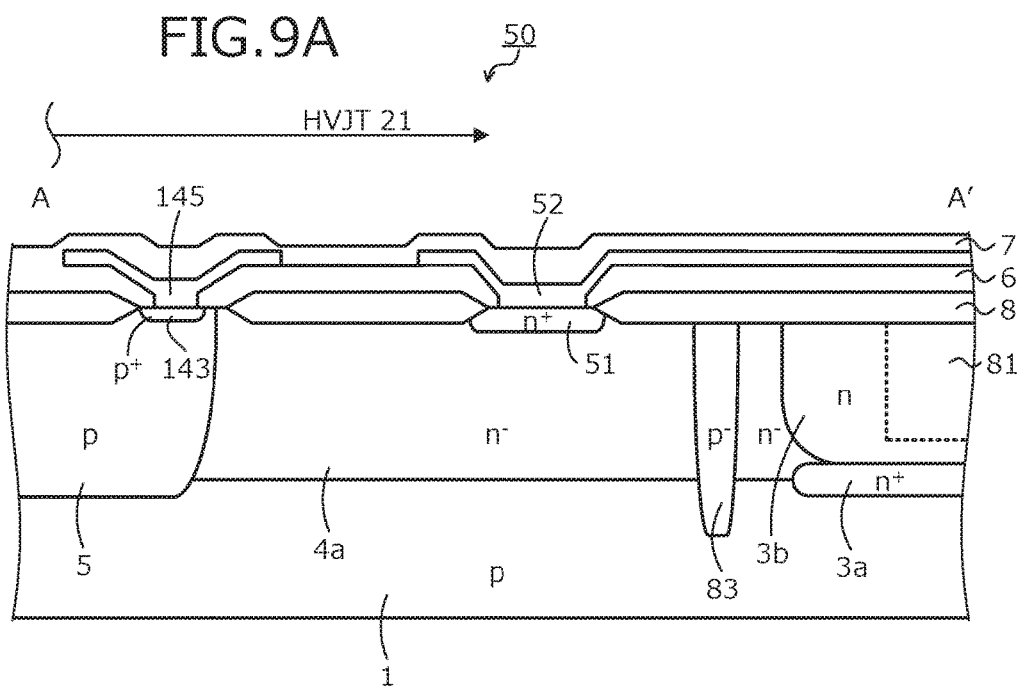

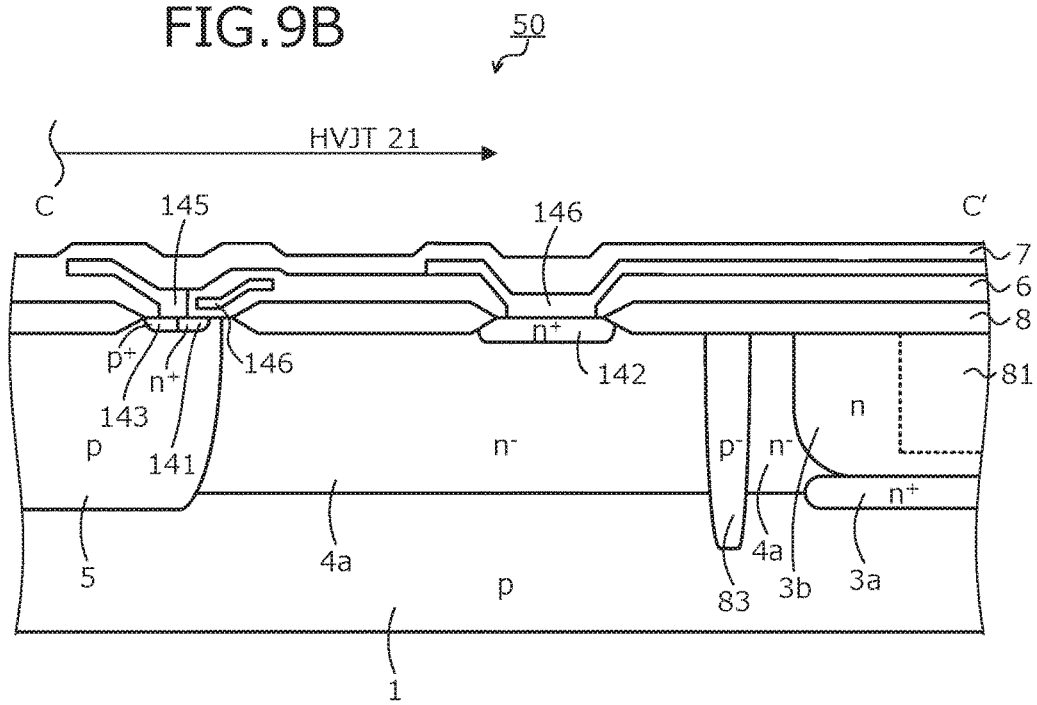
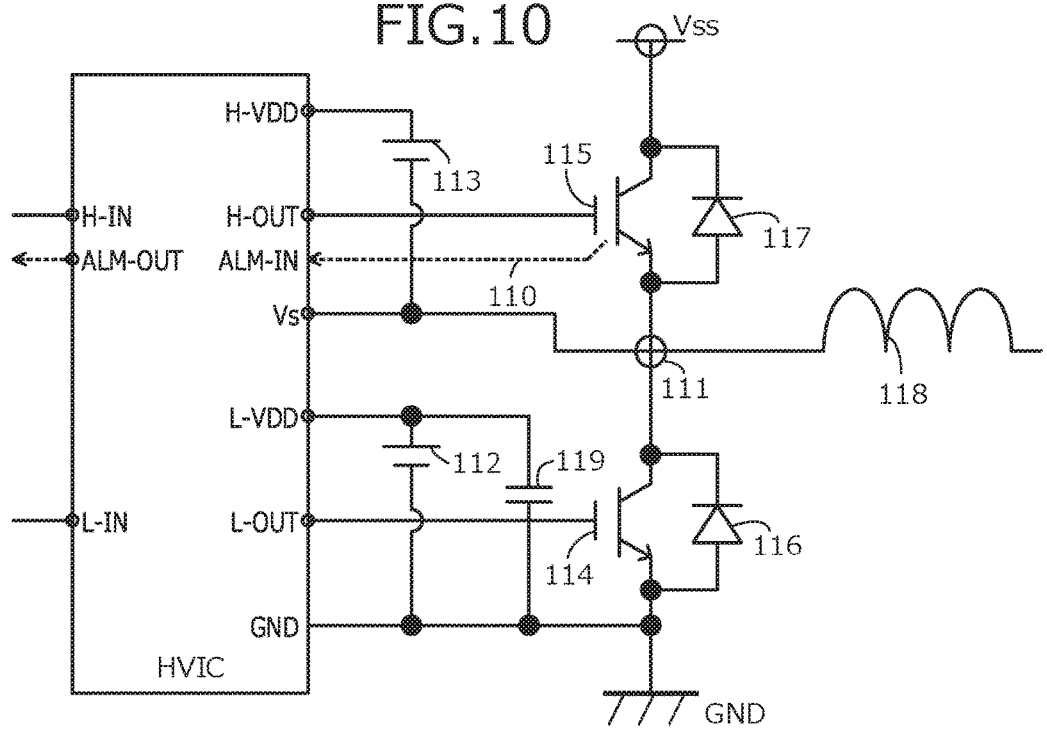

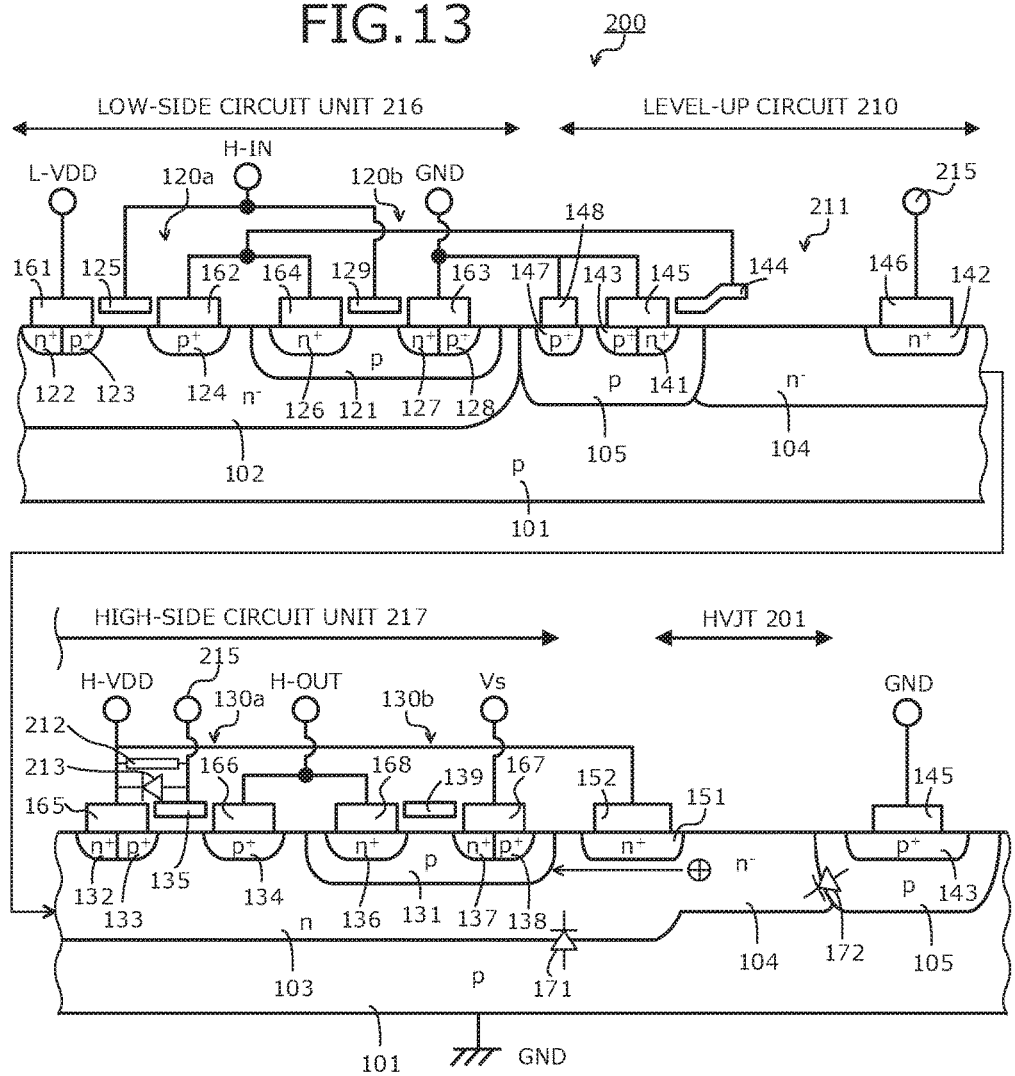

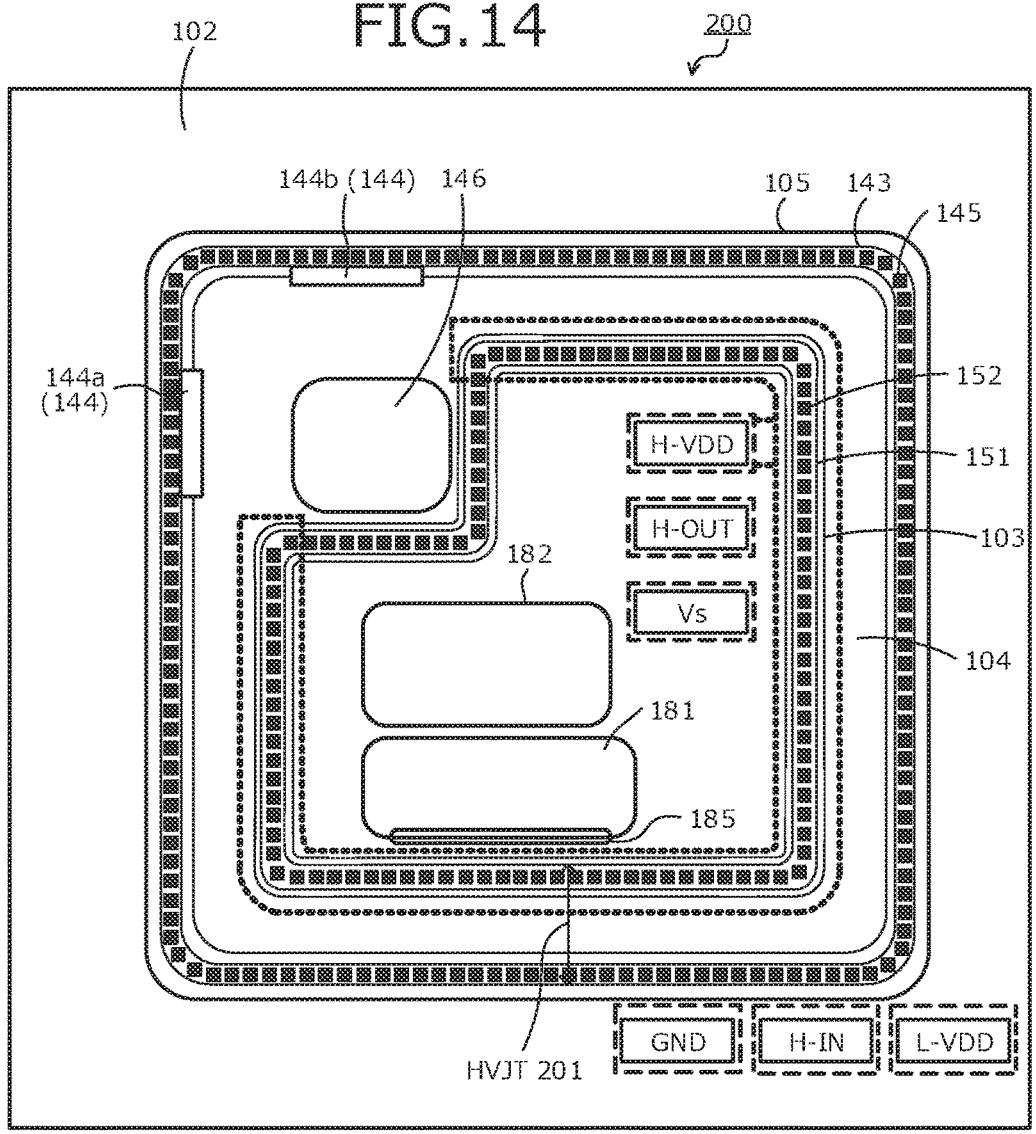

SEMICONDUCTOR INTEGRATED CIRCUIT DEVICE

CROSS REFERENCE TO RELATED APPLICATIONS

This is a continuation application of International Application PCT/JP2015/067370 filed on Jun. 16, 2015, which claims priority from a Japanese Patent Application No. 2014-137241 filed on Jul. 2, 2014. The contents of the applications are incorporated herein by reference.

BACKGROUND OF THE INVENTION

1. Field of the Invention

The embodiments discussed herein are related to a semiconductor integrated circuit device.

2. Description of the Related Art

High-voltage integrated circuit devices (HVICs) of an element isolation system utilizing high-voltage junction are semiconductor integrated circuit devices that drive and turn on/off switching power devices making up an upper arm of a bridge circuit for power inversion (DC-AC conversion) such as a pulse width modulation (PWM) inverter. An HVIC has a means of detecting overcurrent and temperature during times of malfunction of the switching power device and thereby affords higher performance. Further, an HVIC enables a smaller size and a lower cost since differing potentials are not isolated by a transformer, a photocoupler, etc.

A conventional HVIC connection configuration will be described taking, as an example, an HVIC driving an insulated gate bipolar transistor (IGBT) used as a switching power device in power conversion equipment such as an inverter. FIG. 10 is a circuit diagram of a connection configuration of a high-voltage integrated circuit device. FIG. 10 depicts a power conversion device including a half bridge circuit with two switching power devices (IGBTs 114, 115) connected in series.

The power conversion device depicted in FIG. 10 includes an HVIC, low-voltage power sources (first and second low-voltage power sources) 112, 113, the IGBTs 114, 115, free wheel diodes (FWDs) 116, 117, an L-load (inductive load) 118, and a capacitor 119. This power conversion device alternately turns on the IGBT 115 and the IGBT 114 acting as an upper arm and a lower arm, respectively, of the half bridge circuit whereby output at a high potential or a low potential is alternately output from a Vs terminal 111 acting as an output terminal, thereby supplying AC power to the L-load 118.

In particular, the HVIC is a driving element complementarily turning on/off the IGBT 115 and the IGBT 114 acting as the upper arm and the lower arm, respectively, of the half bridge circuit. If the output from the Vs terminal is at a high potential, the HVIC operates the IGBTs 114, 115 to turn on the upper-arm IGBT 115 and turn off the lower-arm IGBT 114. On the other hand, if the output from the Vs terminal 111 is at a low potential, the HVIC operates the IGBTs 114, 115 to turn off the upper-arm IGBT 115 and turn on the lower-arm IGBT 114.

During an operation period, the HVIC outputs a gate signal of the lower-arm IGBT 114 from an L-OUT by using a potential of a GND (grounding potential) as a reference. The HVIC outputs a gate signal of the upper-arm IGBT 115 from an H-OUT by using the potential of the Vs terminal 111 as a reference. The HVIC includes a level shift function (a level shifter circuit (a level-up circuit and a level-down circuit) not depicted) so as to output the gate signal of the upper-arm IGBT 115 from the H-OUT by using the potential of the Vs terminal 111 as a reference.

The level-up circuit increases the logic level of a signal input from an H-IN and generates the gate signal of the IGBT 115. The level-down circuit inputs an abnormality signal 110 related to overheating or overcurrent of the IGBT 115, forms an alarm signal based on the abnormality signal 110 and decreases the level of this alarm signal. The H-IN is connected to a gate of a complementary metal oxide semiconductor (CMOS) circuit (a low-side circuit unit not depicted) that is a peripheral circuit on the low side (upstream) of the level-up circuit. The H-IN is an input terminal receiving an input signal transferred to the low-side circuit unit upstream from the level-up circuit.

The H-OUT is connected to an output terminal of a CMOS circuit (high-side circuit not depicted) that is a peripheral circuit on the high side (downstream) of the level-up circuit. The H-OUT is connected to a gate of the upper-arm IGBT 115 disposed downstream from the HVIC. The H-OUT is an output terminal supplying a gate signal to the IGBT 115. An L-IN is an input terminal receiving an input signal transferred to a CMOS circuit that supplies a gate signal to the IGBT 114. The CMOS circuit supplying the gate signal to the IGBT 114 generates the gate signal of the IGBT 114 based on a logic level of a signal input from the L-IN.

The L-OUT is connected to an output terminal of the CMOS circuit that supplies a gate signal to the IGBT 114. The L-OUT is connected to a gate of the lower-arm IGBT 114 disposed downstream from the HVIC. The L-OUT is an output terminal supplying the gate signal to the IGBT 114. An ALM-IN indicates an input of the abnormality signal 110 of the IGBT 115. The abnormality signal 110 is input to a detection circuit (not depicted) that forms the alarm signal based on the abnormality signal 110. An ALM-OUT is connected to an output terminal of a CMOS circuit (low-side circuit not depicted) that is a peripheral circuit on the low side (downstream) of the level-down circuit. The ALM-OUT is an output terminal that outputs the alarm signal for which the level has been decreased by the level-down circuit.

An H-VDD is a terminal connected to the high-potential side of the low-voltage power source 113 that uses a potential of a Vs as a reference. An L-VDD is a terminal connected to the high-potential side of the low-voltage power source 112 using the potential of the GND as a reference. The Vs is a terminal having an intermediate potential (floating potential) varying from a potential of a high-potential-side Vss of a high-voltage power source (main circuit power source) to the potential of the GND and has the same potential as the Vs terminal 111. The GND is a ground (grounding) terminal. The low-voltage power source 112 is a low-side drive power source connected between the L-VDD and the GND of the HVIC. The low-voltage power source 113 is a high-side drive power source connected between the H-VDD and the Vs of the HVIC. In the case of a bootstrap circuit system, the low-voltage power source 113 is made up of an external capacitor (not depicted) charged by an external bootstrap diode (not depicted) connected between the L-VDD and the H-VDD.

The IGBT 114 has an emitter connected to the GND on the low-potential side of the high-voltage power source and has a collector connected to an emitter of the IGBT 115. The IGBT 115 has a collector connected to the high-potential-side Vss of the high-voltage power source. The IGBTs 114, 115 are respectively connected to FWDs 116, 117 in anti-parallel. A connection point between the collector of the IGBT 114 and the emitter of the IGBT 115 (i.e., an output terminal of the half bridge circuit) is connected to the Vs terminal 111. The Vs terminal 111 is connected to the Vs of the HVIC and the L-load 118. The L-load 118 is AC resistance (reactance), for example, a motor or an illumination, operating by using a bridge circuit formed by combining the half bridge circuits (the IGBTs 114, 115). The capacitor 119 is connected between the L-VDD and the GND.

The level shifter circuit (the level-up circuit and the level-down circuit) of the HVIC will be described. FIG. 11 is a circuit diagram of the level-up circuit. FIG. 12 is a circuit diagram of the level-down circuit. FIGS. 11 and 12 include CMOS circuits that transfer input signals to the level shifter circuit and CMOS circuits that transfer output signals of the level shifter circuit to downstream peripheral circuits of the level shifter circuit. An H-IN, an H-OUT, an ALM-IN, an ALM-OUT, an H-VDD, an L-VDD, a Vs, and a GND depicted in FIGS. 11 and 12 respectively correspond to the H-IN, the H-OUT, the ALM-IN, the ALM-OUT, the H-VDD, the L-VDD, the Vs, and the GND depicted in FIG. 10.

A level-up circuit 210 depicted in FIG. 11 includes an n-channel insulated gate field effect transistor (Metal Oxide Semiconductor Field Effect Transistor (MOSFET)) 211, a level shift resistor 212, and a diode 213. The level-up circuit 210 is necessary when the upper-arm IGBT 115 of the half bridge circuit is of an n-channel type. The drain of the re-channel MOSFET 211 is connected to one end of the level shift resistor 212 and the source is grounded. The n-channel MOSFET 211 has a built-in body diode 214 connected in anti-parallel to the n-channel MOSFET 211. A connection point between the n-channel MOSFET 211 and the level shift resistor 212 is an output unit 215 of the level-up circuit 210.

The other end of the level shift resistor 212 is connected to the H-VDD. The diode 213 is connected in parallel to the level shift resistor 212. The diode 213 has a function of preventing the level shift resistor 212 from generating heat and being destroyed by the heat generated when the potential of the H-VDD becomes considerably lower than the potential of the GND (when excessive negative surge voltage (hereinafter, negative surge voltage) is applied). The diode 213 has a function of preventing excessive voltage from being applied to a gate of a CMOS circuit of a high-side circuit unit 217 described later when overvoltage is applied to the H-VDD during on-operation of the n-channel MOSFET 211. Typically, a Zener diode is frequently used for the diode 213.

A low-side circuit unit 216 and the high-side circuit unit 217 are disposed upstream and downstream from the level-up circuit 210 as peripheral circuits of the level-up circuit 210. Both the low-side circuit unit 216 and the high-side circuit unit 217 include a CMOS circuit complementarily connecting a p-channel MOSFET (PMOS) and an n-channel MOSFET (NMOS). A gate of the CMOS circuit of the low-side circuit unit 216 is connected to the H-IN and receives input of the input signal transferred from the HVIC. The source of the p-channel MOSFET of the CMOS circuit of the low-side circuit unit 216 is connected to the L-VDD and the source of the re-channel MOSFET is grounded. The low-side circuit unit 216 and the high-side circuit unit 217 may include a transmission circuit other than the CMOS circuits.

A connection point (an output terminal) between the p-channel MOSFET and the n-channel MOSFET making up the CMOS circuit of the low-side circuit unit 216 is connected to a gate of the n-channel MOSFET 211 to transfer the input signal to the level-up circuit 210. A gate of the CMOS circuit of the high-side circuit unit 217 is connected to the output unit 215 of the level-up circuit 210 to receive input of the input signal transferred from the level-up circuit 210. In the CMOS circuit (hereinafter, second CMOS circuit) of the high-side circuit unit 217, the source of a p-channel MOSFET (hereinafter, second p-channel MOSFET) 130*a* is connected to the H-VDD and the source of an n-channel MOSFET (hereinafter, second n-channel MOSFET) 130*b* is connected to the Vs. A connection point between the second p-channel MOSFET 130*a* and the second n-channel MOSFET 130*b* making up the CMOS circuit of the high-side circuit unit 217 is connected to the H-OUT to transfer the input signal to the HVIC.

When an input signal from the H-IN is input to the gate of the CMOS circuit of the low-side circuit unit 216 in the level-up circuit 210 as described above, the signal is input via the CMOS circuit of the low-side circuit unit 216 to the gate of the n-channel MOSFET 211 of the level-up circuit 210. In response to the input of this input signal, the n-channel MOSFET 211 is turned on/off and an output signal is output from the output unit 215 of the level-up circuit 210 and input to the gate of the CMOS circuit of the high-side circuit unit 217. In response to the input of this signal, the CMOS circuit of the high-side circuit unit 217 is turned on/off, and an output signal of the CMOS circuit of the high-side circuit unit 217 (a signal for which the level has been increased by the level-up circuit 210) is output from the H-OUT. This output signal is converted into a signal using the potential of the Vs terminal 111 as a reference and is input to the gate of the upper-arm IGBT 115. In response to the input of this signal, the upper-arm IGBT 115 of the half bridge circuit is turned on/off.

As depicted in FIG. 12, the level-down circuit 220 includes a p-channel MOSFET 221, a level shift resistor 222, and a diode 223. The drain of the p-channel MOSFET 221 is connected to one end of the level shift resistor 222 and the source is connected to the H-VDD. The p-channel MOSFET 221 has a built-in body diode 224 connected in anti-parallel to the p-channel MOSFET 221. A connection point between the p-channel MOSFET 221 and the level shift resistor 222 is an output unit 225 of the level-up circuit 210. The other end of the level shift resistor 222 is grounded. The diode 223 is connected in parallel to the level shift resistor 222. The diode 223 has a function of preventing the level shift resistor 222 from generating heat and being destroyed by the heat generated when the potential of the H-VDD becomes considerably lower than the potential of the GND. The diode 223 also has a function of preventing excessive voltage from being applied to a gate of a CMOS circuit of a low-side circuit unit 227 described later when overcurrent is applied to the H-VDD during on-operation of the p-channel MOSFET 221.

A high-side circuit unit 226 and the low-side circuit unit 227 are disposed upstream and downstream from the level-down circuit 220 as peripheral circuits of the level-down circuit 220. Both the high-side circuit unit 226 and the low-side circuit unit 227 include a CMOS circuit complementarily connecting a p-channel MOSFET and an re-channel MOSFET. A gate of the CMOS circuit of the high-side circuit unit 226 receives input of an alarm signal formed based on the abnormality signal 110. The source of the p-channel MOSFET of the CMOS circuit of the high-side circuit unit 226 is connected to the H-VDD and the source of the re-channel MOSFET is connected to the Vs.

The low-side circuit unit 227 and the high-side circuit unit 227 may include a transmission circuit other than the CMOS circuits.

A connection point (an output terminal) between the p-channel MOSFET and the n-channel MOSFET making up the CMOS circuit of the high-side circuit unit 226 is connected to a gate of the p-channel MOSFET 221 to transfer the input signal to the level-down circuit 220. A gate of the CMOS circuit of the low-side circuit unit 227 is connected to the output unit 225 of the level-down circuit 220 to receive the input of the input signal transferred from the level-down circuit 220. In the CMOS circuit of the low-side circuit unit 227, a source of the p-channel MOSFET is connected to the L-VDD and a source of the n-channel MOSFET is grounded. A connection point between the p-channel MOSFET and the n-channel MOSFET making up the CMOS circuit of the low-side circuit unit 227 is connected to the ALM-OUT to output the output signal from the ALM-OUT to the outside.

When an alarm signal based on the abnormality signal 110 is input to the gate of the CMOS circuit of the high-side circuit unit 226 in the level-down circuit 220 as described above, the signal is input via the CMOS circuit of the high-side circuit unit 226 to the gate of the p-channel MOSFET 221 of the level-down circuit 220. In response to the input of this signal, the p-channel MOSFET 221 is turned on/off and an output signal is output from the output unit 225 of the level-down circuit 220 and input to the gate of the CMOS circuit of the low-side circuit unit 227. In response to the input of this signal, the CMOS circuit of the low-side circuit unit 227 is turned on/off, and an output signal of the CMOS circuit of the low-side circuit unit 227 (an alarm signal for which the level has been decreased by the level-down circuit 220) is output from the ALM-OUT.

A cross-sectional structure of a conventional HVIC will be described. FIG. 13 is a cross-sectional view of a conventional high-voltage integrated circuit device. Among the constituent elements of a self-isolated HVIC 200, FIG. 13 depicts main portions of the low-side circuit unit 216, the high-side circuit unit 217, the level-up circuit 210, and the level-up circuit 210 as well as a high-voltage junction termination region (HVJT) 201. An arrow continuing from the left side of a cross-sectional view depicted on the upper side to the left side of the cross-sectional view depicted on the lower side of FIG. 13 indicates that the cross-sectional view depicted on the upper side and the cross-sectional view depicted on the lower side represent one continuous p-type semiconductor substrate 101 (a semiconductor chip). An H-IN, an H-OUT, an H-VDD, an L-VDD, a Vs, and a GND are terminals respectively corresponding to the H-IN, the H-OUT, the H-VDD, the L-VDD, the Vs, and the GND of the HVIC depicted in FIG. 10.

As depicted in FIG. 13, the conventional HVIC 200 has $n^-$-type well regions 102, 104, an n-type well region 103, and a p-type well region 105 each selectively disposed in a surface layer on a front surface of the p-type semiconductor substrate 101 connected to the GND. The $n^-$-type well region 104 surrounds the periphery of the n-type well region 103 and the $n^-$-type well region 102 is disposed outside (toward the periphery of the chip) the $n^-$-type well region 104. The p-type well region 105 is disposed between the $n^-$-type well region 102 and the $n^-$-type well region 104 and contacts the $n^-$-type well region 102 and the $n^-$-type well region 104.

In the $n^-$-type well region 102, the low-side circuit units 216, 227 that are peripheral circuits of the level shifter circuit are disposed. FIG. 13 depicts a first CMOS circuit (a p-channel MOSFET (hereinafter, first p-channel MOSFET) 120a and an n-channel MOSFET (hereinafter, first re-channel MOSFET) 120b) making up the low-side circuit unit 216. In the n-type well region 103, the level shifter circuit and the high-side circuit units 217, 226 that are peripheral circuits of the level shifter circuit are disposed. FIG. 13 depicts a second CMOS circuit (the second p-channel MOSFET 130a and the second n-channel MOSFET 130b) making up the high-side circuit unit 217.

The first p-channel MOSFET 120a includes a typical horizontal MOS gate (an insulated gate made of metal-oxide-semiconductor) structure made up of the $n^-$-type well region 102, an $n^+$-type contact region 122, a $p^+$-type source region 123, a $p^+$-type drain region 124, and a gate electrode 125, as well as a source electrode 161 and a drain electrode 162. The gate electrode 125 is connected to the H-IN. The source electrode 161 is connected to the L-VDD. The drain electrode 162 is connected to a drain electrode 164 of the first re-channel MOSFET 120b.

The first n-channel MOSFET 120b includes a typical horizontal MOS gate structure made up of a p-type offset region 121, an $n^+$-type drain region 126, an $n^+$-type source region 127, a $p^+$-type contact region 128, and a gate electrode 129, as well as a source electrode 163 and a drain electrode 164. The gate electrode 129 is connected to the gate electrode 125 of the first p-channel MOSFET 120a and is also connected to the H-IN. The source electrode 163 is connected to the GND. The drain electrode 164 is connected to the drain electrode 162 of the first p-channel MOSFET 120a.

The second p-channel MOSFET 130a includes a typical horizontal MOS gate structure made up of the n-type well region 103, an $n^+$-type contact region 132, a $p^+$-type source region 133, a $p^+$-type drain region 134, and a gate electrode 135, as well as a source electrode 165 and a drain electrode 166. The gate electrode 135 is connected to the output unit 215 of the level-up circuit 210. The level shift resistor 212 and the diode 213 are connected in parallel between the H-VDD and the output unit 215. The source electrode 165 is connected to the H-VDD. The drain electrode 166 is connected to the H-OUT.

The second n-channel MOSFET 130b includes a typical horizontal MOS gate structure made up of a p-type offset region 131, an $n^+$-type drain region 136, an $n^+$-type source region 137, a $p^+$-type contact region 138, and a gate electrode 139, as well as a source electrode 167 and a drain electrode 168. The gate electrode 139 is connected to the gate electrode 135 of the second p-channel MOSFET 130a (not depicted). The source electrode 167 is connected to the Vs. The drain electrode 168 is connected to the drain electrode 166 of the second p-channel MOSFET 130a and is also connected to the H-OUT.

The n-channel MOSFET 211 making up the level-up circuit 210 is disposed from the n-type well region 103 across the $n^-$-type well region 104 to the p-type well region 105 to contact the $n^-$-type well region 104. The n-channel MOSFET 211 making up the level-up circuit 210 includes the n-type well region 103, the $n^-$-type well region 104, the p-type well region 105, an $n^+$-type source region 141, an $n^+$-type drain region 142, a $p^+$-type contact region 143, a gate electrode 144, a source electrode 145, and a drain electrode 146. The p-type well region 105 acts as a base region.

The $n^+$-type source region 141 and the $p^+$-type contact region 143 are selectively disposed inside the p-type well region 105. The $n^+$-type drain region is selectively disposed inside the n-type well region 103. On a surface of the p-type well region 105 interposed between the n+-type source region 141 and the n−-type well region 104, the gate electrode 144 is disposed via a gate insulating film. The gate electrode 144 is connected to the drain electrode 162 of the first p-channel MOSFET 120a and the drain electrode 164 of the first n-channel MOSFET 120b. The source electrode 145 is in contact with the n+-type source region 141 and the p+-type contact region 143. The source electrode 145 is connected to the GND.

The drain electrode 146 contacts the n+-type drain region. The drain electrode 146 is connected through surface metal wiring (not depicted) to the level shift resistor 212 and is connected via the level shift resistor 212 to the H-VDD. A connection portion between the drain electrode 146 and the level shift resistor 212 is the output unit 215 of the level-up circuit 210. The output from the output unit 215 is at low and high potentials when the n-channel MOSFET 211 is turned on and off, respectively. Therefore, the HVIC 200 can perform a level shift operation that is signal transfer between different reference potentials. Reference numeral 147 denotes a p+-type contact region and reference numeral 148 denotes a pickup electrode.

The source electrode (hereinafter, first pickup electrode) 145 of the n-channel MOSFET 211 acts as a pickup electrode extracting from the p+-type contact region (hereinafter, first high-concentration region) 143, electrons injected into the p-type well region 105 at the occurrence of negative surge voltage. In a surface layer on the substrate front surface side of the n-type well region 103, an n+-type contact region (hereinafter, second high-concentration region) 151 is disposed near a boundary with the n−-type well region 104. A second pickup electrode 152 contacts the second high-concentration region 151. The second pickup electrode 152 is connected to the H-VDD and has a function of extracting from the second high-concentration region 151, holes injected into the n-type well region 103 at the occurrence of the negative surge voltage.

Bridge circuits formed by combining the half bridge circuits made up of switching power devices (the IGBTs 114, 115) using the HVIC 200 described above as a driving element are widely used not only in inverters for controlling motors but also in a number of fields such as power source applications for plasma display panels (PDPs) and liquid crystal panels and inverters for home electrical appliances including air conditioners and lighting. Other than IGBTs, power MOSFETs are used for the switching power devices making up the half bridge circuits. These motors and illuminations act as the L-load 118 as described above. Therefore, the Vs and the H-VDD of the HVIC 200 are adversely affected by parasitic inductance components, etc. due to wiring on a printed board, a cable to the L-load 118, etc.

When the upper-arm IGBT 115 is turned off, this parasitic inductance component causes the potential of the Vs terminal 111 (the reference potential of the high-side circuit units 217, 226) and the potential of the H-VDD (the potential using the potential of the Vs terminal 111 as a reference) to vary toward the negative potential side relative to the GND potential (0 V). For example, negative surge voltage $V_{SO}$ having a negative potential relative to the GND potential is applied to the Vs terminal 111 when the upper-arm IGBT 115 is turned off. This negative surge voltage $V_{SO}$ can be calculated by Equation (1). In Equation (1), $L_0$ is an inductance value of the L-load 118 and l is a value of a current flowing through the IGBT 115.

$$V_{SO}=L_0 \times dI/dt \quad (1)$$

When the negative surge voltage $V_{SO}$ applied to the Vs terminal 111 becomes lower than [GND potential−($V_{supply}$+ $V_{fd}$)], parasitic pn diodes 171, 172 of the self-isolated HVIC 200 (chip) begins to conduct. The parasitic pn diode 171 is made up of the p-type semiconductor substrate 101 and the n-type well region 103. The parasitic pn diode 172 is made up of the p-type well region 105 and the n−-type well region 104. $V_{supply}$ is a battery voltage of the low-voltage power source 113 or between both ends of a bootstrap capacitor not depicted. $V_{fd}$ is a forward voltage drop of the parasitic pn diodes 171, 172.

If the potential of the Vs terminal 111 is significantly pulled in the negative direction, overcurrent flows through the HVIC 200 (chip). This may cause malfunction or latch-up of the high-side circuit unit 217 making up the HVIC 200, resulting in breakdown or destruction of the HVIC 200. While the potential of the Vs terminal 111 is pulled in the negative direction, a spike-shaped negative surge (an abrupt surge associated with a current change) voltage $V_{S1}$ (=$L_1 \times dI_1/t$) projecting in the negative direction is applied to the Vs terminal 111 in proportion to the product of a parasitic inductance component $L_1$ due to wiring on a printed board, a cable to the L-load 118, etc. from the HVIC 200 and a period $dI_1/t$ required until the on-current $l_1$ flowing through the IGBT 115 during off-time of the IGBT 115 becomes zero. For example, the negative surge voltage $V_{SO}$ applied to the Vs terminal 111 in this case is about −30 V, for example, and the application period thereof is approximately several hundred to 500 ns.

A planar layout of the constituent units of the conventional HVIC 200 will be described with reference to FIGS. 13 and 14. FIG. 14 is a planar view of a planar layout of the high-voltage integrated circuit device of FIG. 13. FIG. 14 depicts the HVJT 201 including a high potential region in which the high-side circuit units 217, 226 are disposed, a low potential region in which the low-side circuit units 216, 227 are disposed, and a region (hereinafter, common potential region) to which voltage at a common potential (GND potential) is applied. As depicted in FIG. 14, the n-type well region 103 is the high potential region and the high-side circuit unit 217, an H-VDD pad, an H-OUT pad, a Vs pad, etc. are disposed therein. FIG. 14 depicts a Vs potential region 181 connected to the Vs pad and an H-VDD potential region 182 connected to an H-VDD pad.

The Vs potential region 181 is electrically connected to the Vs pad and is a region to which voltage at the potential of the Vs is applied. For example, the Vs potential region 181 corresponds to the p-type offset region 131 and the p+-type drain region 134 of the second n-channel MOSFET 130b making up a logic unit of the high-side circuit unit 217. The H-VDD potential region 182 is electrically connected to the H-VDD pad and is a region to which voltage at the potential of the H-VDD is applied. For example, the H-VDD potential region 182 is a region in which the n+-type contact region 132 and the p+-type source region 133 of the second p-channel MOSFET 130a of the high-side circuit unit 217 are disposed. The n−-type well region 104 is a breakdown voltage region and is disposed so as to surround and contact the n-type well region 103.

The second high-concentration region 151 is an n+-type contact region and is disposed in the n-type well region 103, along the perimeter of the n-type well region 103, near the boundary with the n−-type well region 104. The second high-concentration region 151 is disposed away from the n−-type well region 104. The second pickup electrode 152 is disposed on the second high-concentration region 151. The second pickup electrode 152 is connected to the H-VDD pad. The p-type well region 105 is the common potential region and is disposed to contact the n⁻-type well region 104 and surround the periphery of the n⁻-type well region 104. The first high-concentration region 143 is a p⁺-type contact region and is annularly disposed in the p-type well region 105 along the outer circumference of the n⁻-type well region 104. The first pickup electrode 145 is disposed on the first high-concentration region 143.

In FIG. 14, black squares respectively arranged as the first and second pickup electrodes 145, 152 are portions of the first and second pickup electrodes 145, 152 that are deposited on an interlayer insulating film and a protective film (not depicted) covering a chip front surface and that are embedded in contact holes. Therefore, the black squares representing the first and second pickup electrodes 145, 152 are contacts (electric contact portions) with the first and second high-concentration regions 143, 151. Although not depicted in FIG. 14, the first and second pickup electrodes 145, 152 are annularly arranged on the first and second high-concentration regions 143, 151, respectively. The HVJT 201 is made up of the first and second high-concentration regions 143, 151 as well as the n-type well region 103, the p-type well region 105, and the n⁻-type well region 104 interposed between the first high-concentration region 143 and the second high-concentration region 151.

In the HVJT 201, the level shifter circuit is disposed from the n-type well region 103 across the n⁻-type well region 104 to the p-type well region 105 in a region including a corner portion of the n⁻-type well region 104 having an approximately rectangular annular shape, for example. FIG. 14 depicts the n⁺-type drain region 142, the gate electrodes 144 (144a, 144b), and the drain electrode 146 of the n-channel MOSFET 211 of the level-up circuit 210. The n-channel MOSFET 211 makes up a reset-set (RS) flip-flop retaining a state in which the output signal (gate signal) of the IGBT 115 is reset to a low level or set to a high level.

The n-type well region 103 has a planar shape of an approximately recessed square having one corner portion recessed inward (toward a chip center portion) and the n⁺-type drain region 142 is disposed in the n⁻-type well region 104 in a recessed portion of the n-type well region 103. The drain electrode 146 is disposed on the n⁺-type drain region 142. Although not depicted, the n⁺-type drain region 142 and the drain electrode 146 are disposed for each of the setting and resetting n-channel MOSFETs 211. The gate electrodes 144a, 144b receiving inputs of set and reset signals are disposed in the n⁻-type well region 104 and the p-type well region 105. The gate electrodes 144a, 144b are respectively disposed on straight line portions corresponding to two sides sharing one corner portion of the approximately rectangular annular p-type well region 105.

The n⁻-type well region 102 is the low potential region and is disposed around the p-type well region 105 to contact the p-type well region 105 and surround the periphery of the p-type well region 105. The n⁻-type well region 102 has a logic unit (not depicted) of the low-side circuit unit 216, a GND pad, an H-IN pad, and an L-VDD pad disposed therein. In FIG. 14, dashed lines surrounding the pads indicate regions into which current flowing through a parasitic pn diode flows (similarly with respect to FIGS. 1 and 3 to 5). A region indicated by dotted lines (dotted lines surrounding a portion of the second high-concentration region 151 and contacting with the H-VDD pad) is a wiring layer connecting the drain electrode 146 and the second pickup electrode 152 of the re-channel MOSFET 211 with the H-VDD pad.

If the conventional HVIC 200 is reduced in chip size by efficiently arranging the Vs potential region 181 and the H-VDD potential region 182 without waste, the Vs potential region 181 is disposed near the periphery of the n-type well region 103 in proximity to the second high-concentration region 151 of the HVJT 201. Therefore, one side 185 of the approximately rectangular Vs potential region 181 is parallel to and faces one inner peripheral side of the approximately rectangular annular second high-concentration region 151 surrounding the periphery of the n-type well region 103. As a result, the distance between the Vs potential region 181 and the HVJT 201 can be minimized on the one side (hereinafter, facing position) 185 of the second high-concentration region 151 facing the Vs potential region 181.

To protect such an HVIC driving a half-bridge type power transistor in anticipation of an excessive negative swing (application of negative serge voltage) at an output node, a circuit has been proposed that includes a resistor connected in series with a parasitic diode on the HVIC chip and disposed between a substrate and a ground potential terminal of the HVIC chip so as to limit current in a negative voltage spike (a negative surge) flowing through the parasitic diode of the HVIC due to a negative voltage transient phenomenon at the output node (see, e.g., Japanese Patent No. 3346763).

As another HVIC, a device has been proposed that diminishes an adverse effect of a negative voltage (an reverse bias) applied at a level exceeding the rated breakdown voltage, by inserting a diode between a drain electrode of a switching element belonging to a level shifter circuit and a gate electrode of a MOS transistor belonging to an amplifier (a CMOS circuit) (see, e.g., Japanese Laid-Open Patent Publication No. 2001-25235). In Japanese Laid-Open Patent Publication No. 2001-25235, the operation of the amplifier is prevented from being adversely affected by current flowing backward through the switching element.

As another HVIC, a device has been proposed that has a level shift resistor, a current-limiting resistor, and a switching element (with a drain on the high potential side) making up a level-up circuit connected in this order in series from a high voltage side of a high-voltage power source between the high potential side and the low potential (ground potential) side of the high-voltage power source so as to use a portion between the level shift resistor and the current-limiting resistor as an output unit of the level up circuit (see, e.g., Japanese Laid-Open Patent Publication No. 2008-301160). In Japanese Laid-Open Patent Publication No. 2008-301160, the current-limiting resistor is connected to a current path between the high potential side (H-VDD) and the low potential side (GND) of a level shifter circuit using a potential of a Vs terminal as a reference, thereby preventing a body diode of an n-channel MOSFET making up the level-up circuit and a parasitic pn diode itself of the HVIC from being destroyed due to overcurrent and further preventing a position with a small current capacity in the level shifter circuit from being destroyed by overcurrent.

As another HVIC, a device has been proposed that has a high-voltage diode disposed between a common grounding node and a virtual grounding (intermediate potential) node having a high-potential-side reference potential by using a common substrate region inside the HVIC (see, e.g., Japanese Laid-Open Patent Publication No. 2010-263116). In Japanese Laid-Open Patent Publication No. 2010-263116, the high-voltage diode is disposed between a terminal having the high-potential-side reference potential (Vs terminal) and the substrate region having the common ground potential (GND potential), thereby suppressing a reduction in high-potential-side power source voltage due to undershooting of negative voltage generated in the virtual grounding node at the high-potential-side reference potential.

As another HVIC, a device has been proposed that has a planar layout with a double RESURF structure partially added by thinning contacts of an HVJT at a position close to a high-potential-side reference potential region (a Vs potential region) or by widening a width of a breakdown voltage region making up the HVJT (see, e.g., WO 2012/176347). In WO 2012/176347, a reduction is achieved in a carrier injection amount in the high-potential-side reference potential region associated with a reduction in high-potential-side power source voltage due to undershooting of negative voltage.

As another HVIC, a device has been proposed that has an n⁻-type diffusion region annularly formed as a low-voltage region in a p⁻-type semiconductor substrate, that has an n-type diffusion region making up an HVJT annularly formed contacting the inside thereof, and that has an island-shaped n-type diffusion region disposed further inside thereof as a high-voltage region across a predetermined width of the p⁻-type semiconductor substrate (see, e.g., Japanese Patent No. 3917211 (paragraph 0045, FIG. 8)). In the structure proposed in Japanese Patent No. 3917211, an n-type diffusion layer making up the HVJT and an n-type diffusion layer disposed with a high-side circuit unit are separated by an annular p⁻-type diffusion layer.

SUMMARY OF THE INVENTION

According to one aspect of the invention, a semiconductor integrated circuit device includes a first well region of a second conductivity type and disposed on a surface layer of a first surface of a semiconductor layer of a first conductivity type; and a second well region of the second conductivity type, and disposed in the surface layer of the first surface of the semiconductor layer so as to contact the first well region and surround a periphery of the first well region. The second well region has an impurity concentration that is lower than that of the first well region. The semiconductor integrated circuit device further includes a third well region of the first conductivity type, and disposed in the surface layer of the first surface of the semiconductor layer so as to contact the second well region and surround a periphery of the second well region; an isolation region electrically isolating a predetermined region in the first well region from a region farther outward than the predetermined region; and a first high-concentration region of the second conductivity type, and disposed farther outward than the isolation region and inside one of the first well region and the second well region. The first high-concentration region has an impurity concentration that is higher than that of the first well region. The semiconductor integrated circuit device further includes a second high-concentration region of the second conductivity type, and disposed farther inward than the isolation region and inside one of the first well region and the second well region. The second high-concentration region has an impurity concentration that is higher than that of the first well region. The semiconductor integrated circuit device further includes a first electrode contacting the first high-concentration region; and a second electrode contacting with the second high-concentration region. The isolation region passes between the predetermined region and the first high-concentration region crosses the second well region, and reaches the third well region, the isolation region isolating the predetermined region from a region farther outward than the first high-concentration region.

In the semiconductor integrated circuit device, the isolation region is disposed in an annular shape surrounding the predetermined region.

In the semiconductor integrated circuit device, the isolation region is one of a region of the first conductivity type and a dielectric region.

The semiconductor integrated circuit device further includes a fourth well region of the second conductivity type, and disposed on the surface layer of the first surface of the semiconductor layer, adjacent to the third well region so that the third well is between the fourth well region and the first well region; a first circuit unit disposed in the fourth well region; a second circuit unit disposed in the first well region; and a third circuit unit disposed in the second well region and the third well region and connected between the first circuit unit and the second circuit unit. The third circuit unit converts a voltage level of a signal input from the first circuit unit and outputs the signal to the second circuit unit. The second circuit unit outputs based on the signal output from the third circuit unit, a gate signal of a high-side transistor of two serially-connected transistors.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 1 is a planar view of a high-voltage integrated circuit device according to a first embodiment;

FIGS. 2A and 2B are cross-sectional views of along cut lines A-A' and C-C' of FIG. 1, respectively;

FIGS. 4A and 4B are cross-sectional views of a main portion of a high-voltage integrated circuit device according to a second embodiment;

FIGS. 5A and 5B are cross-sectional views of a main portion of another example of the high-voltage integrated circuit device according to the second embodiment;

FIG. 6 is a cross-sectional view of a main portion of a high-voltage integrated circuit device according to a third embodiment;

FIG. 7 is a cross-sectional view of a main portion of a high-voltage integrated circuit device according to a fourth embodiment;

FIG. 8 is a cross-sectional view of the high-voltage integrated circuit device along cut line B-B' in FIG. 7;

FIGS. 9A and 9B are cross-sectional views of a main portion of a high-voltage integrated circuit device according to a fifth embodiment;

FIG. 10 is a circuit diagram of a connection configuration of a high-voltage integrated circuit device;

FIG. 13 is a cross-sectional view of a conventional high-voltage integrated circuit device; and FIG. 14 is a planar view of a planar layout of the high-voltage integrated circuit device of FIG. 13.

DETAILED DESCRIPTION OF THE INVENTION

Figure 3:
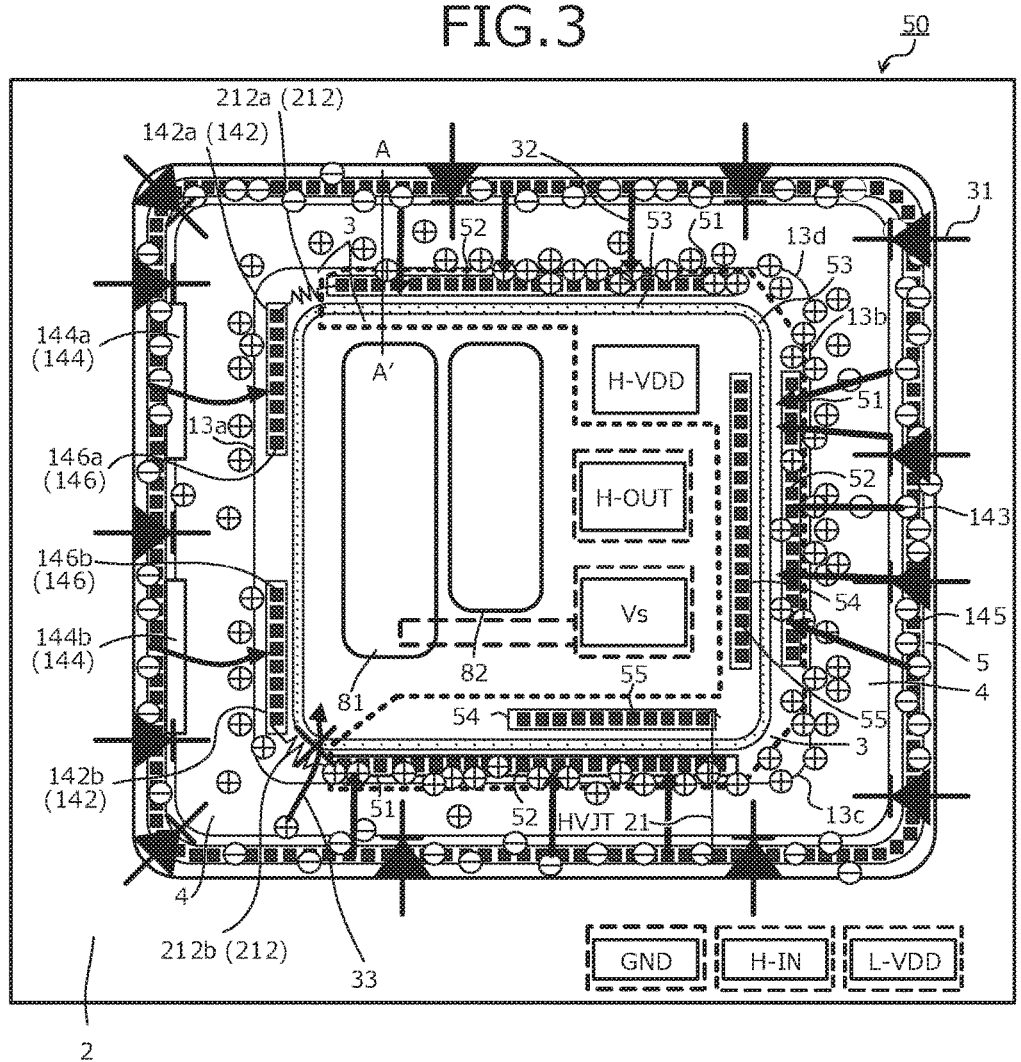
FIG. 3 is an explanatory view of carrier behavior when negative surge voltage is applied to the high-voltage integrated circuit device of FIG. 1.

Embodiments of a semiconductor integrated circuit device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described.

A structure of a semiconductor integrated circuit device according to a first embodiment will be described with reference to FIGS. 1, 2, 7 to 9, taking a self-isolated high-voltage integrated circuit device as an example. FIG. 1 is a planar view of a high-voltage integrated circuit device according to the first embodiment. FIGS. 2A and 2B are cross-sectional views of along cut lines A-A' and C-C' of FIG. 1, respectively. An HVIC 50 according to the first embodiment is a driving element corresponding to an HVIC making up the power conversion device depicted in FIG. 10 and has a function of controlling turning-on/off of IGBTs (transistors) 114, 115 of a half bridge circuit. A connection configuration of the HVIC 50 (the circuit configuration of the power conversion device), a circuit configuration of a level shift function (level shifter circuit) of the HVIC 50, and a method of driving the IGBTs 114, 115 by the HVIC 50 may be achieved in a conventional manner, for example, and therefore, will not be described (see the description of FIGS. 10 to 12).

A planar layout of the HVIC 50 will first be described. As depicted in FIG. 1, the HVIC 50 according to the first embodiment includes a high-potential region, a low-potential region, and a HVJT 21 on a p-type semiconductor substrate (semiconductor layer of a first conductivity type) 1. The high-potential region is a region to which voltage at a potential of an H-VDD (a third potential) and voltage at a potential of a Vs (a second potential) of the HVIC 50 are applied. For example, the high-potential region is an n-type well region (first well region of a second conductivity type) 3 disposed on the front surface side of the p-type semiconductor substrate 1. For example, in the high-potential region, a high-side circuit unit (second circuit unit), which is a peripheral circuit of the level shifter circuit, is disposed.

The low-potential region is a region to which voltage at a potential of an L-VDD (fourth potential) and voltage at a GND (first potential) of the HVIC 50 are applied. For example, the low-potential region is an n$^-$-type well region (a fourth well region of the second conductivity type) 2 disposed farther outward (periphery of chip) than the n-type well region 3. In the low-potential region, a low-side circuit unit (first circuit unit), which is a peripheral circuit of the level shifter circuit, is disposed. The HVJT 21 is a region that includes a breakdown voltage region and a common potential region. Further, for example, the level shifter circuit may be disposed in the HVJT 21. The breakdown voltage region is an n$^-$-type well region (second well region of the second conductivity type) 4 disposed between the n-type well region 3 and the n$^-$-type well region 2.

The common potential region is a region to which voltage at a common potential (e.g., the GND potential (grounding potential)) is applied. For example, the common potential region is a p-type well region (third well region of the first conductivity type) 5 disposed between the n$^-$-type well region 4 and the n$^-$-type well region 2. In the following description, the common potential is the GND potential. The cross-sectional structures of the level shifter circuit and the peripheral circuits of the level shifter circuit are the same as the conventional HVIC (see FIG. 13), for example.

Although the HVIC 50 includes a level-up circuit (a third circuit) 210 and peripheral circuits thereof (a high-side circuit unit 217 and a low-side circuit unit 216) in an example in this description, the HVIC 50 may include a level-down circuit.

The H-VDD is a terminal connected to the high-potential side of a low-voltage power source 113 that is a high-side drive power source using the Vs potential as a reference. The L-VDD is a terminal connected to the high-potential side of a low-voltage power source 112 that is a low-side drive power source using the potential of the GND as a reference. The Vs is a terminal having an intermediate potential (floating potential) varying from a potential of a high-potential-side Vss of a high-voltage power source (main circuit power source) to the potential of the GND. The GND is a ground (grounding) terminal. The H-VDD, the L-VDD, the Vs, and the GND of FIG. 1 are terminals respectively corresponding to the H-VDD, the L-VDD, the Vs, and the GND depicted in FIG. 10 (similarly in FIGS. 3 to 5).

The n-type well region 3 is the high potential region. For example, in the n-type well region 3, the high-side circuit units 217, 226 of the level-up circuit 210, an H-VDD pad (terminal), an H-OUT pad, a Vs pad, n$^+$-type contact regions (hereinafter, second and third high-concentration regions (first and second high-concentration regions of the second conductivity type)) 51, 54, and second and third pickup electrodes (first and second electrodes) 52, 55 are disposed. A Vs potential region (predetermined region) 81 is electrically connected to the Vs pad and is a region to which voltage at the potential of the Vs is applied. In FIG. 1, a wiring layer connecting the Vs potential region 81 and the Vs pad is indicated by a broken line connecting the Vs potential region 81 and the Vs pad.

For example, the Vs potential region 81 is a region in which the p-type offset region 131, the n$^+$-type drain region 136, the n$^+$-type source region 137, and the p$^+$-type contact region 138 of the second n-channel MOSFET 130b, and the p$^+$-type drain region 134 of the second n-channel MOSFET 130a making up the high-side circuit unit 217 are disposed. An H-VDD potential region 82 is electrically connected to the H-VDD pad and is a region to which voltage at the potential of the H-VDD is applied. The potential of the H-VDD pad is a power source voltage of a circuit disposed in the n-type well region 3. For example, the H-VDD potential region 82 is a region in which the n$^+$-type contact region 132 and the p$^+$-type source region 133 of the second p-channel MOSFET 130a of the high-side circuit unit 217 are disposed.

In FIG. 1, the Vs potential region 81 and the H-VDD potential region 82 are depicted in a straight planar shape extending in a direction (hereinafter, first direction) along a first side 13a of a perimeter of the n-type well region 3 having an approximately rectangular planar shape. In FIG. 1, the Vs potential region 81 and the H-VDD potential region 82 are depicted such that the regions are arranged parallel to the first direction and to each other along a direction (hereinafter, second direction) orthogonal to the first direction. Although the Vs potential region 81 and the H-VDD potential region 82 are depicted separately in FIG. 1, the regions disposed in the Vs potential region 81 and the H-VDD potential region 82 are arranged in a mixed manner on the n-type well region 3.

For example, the H-VDD pad, the H-OUT pad, and the Vs pad are disposed near a second side (facing side) 13b of the perimeter of the n-type well region 3, a side that faces the first side 13a where the Vs potential region 81 and the H-VDD potential region 82 are disposed. The H-VDD pad, the H-OUT pad, and the Vs pad are arranged in this order parallel to each other along the first direction, for example. The third high-concentration region 54 is disposed near the second side 13b and faces the pads (the H-VDD pad, the H-OUT pad, and the Vs pad) on sides thereof facing the second side 13b. The third high-concentration region 54 has a straight planar shape extending in a direction (the first direction) parallel to the first side 13a of the perimeter of the n-type well region 3.

Among the remaining two sides (two sides that face each other making another set in addition to the facing first and second sides 13a, 13b) 13c, 13d of the perimeter of the n-type well region 3, the third high-concentration region 54 is disposed along the third side 13c facing the Vs pad. The third high-concentration region 54 disposed along the third side 13c of the perimeter of the n-type well region 3 is disposed so as not to face the Vs potential region 81, for example. The third high-concentration regions 54 respectively disposed along the second and third sides 13b, 13c of the perimeter of the n-type well region 3 are disposed away from each other. Therefore, third high-concentration regions 54 are not disposed in one corner portion shared by the second and third sides 13b, 13c of the perimeter of the n-type well region 3. On the third high-concentration region 54, the third pickup electrode 55 is annularly disposed along the third high-concentration region 54. The third pickup electrode 55 is connected to the H-VDD pad. The third high-concentration region 54 is formed for a purpose of stabilizing the potential of the n-type well region 3 and may be formed in a region in which a circuit is not formed, as possible. The third high-concentration region 54 may be omitted.

The n-type well region 3 has a $p^-$-type region (hereinafter, $p^-$-type isolation region (isolation region)) 53 disposed annularly along the perimeter of the n-type well region 3. The $p^-$-type isolation region 53 achieves junction isolation inside the n-type well region 3. For example, the $p^-$-type isolation region 53 achieves junction isolation of the n-type well region 3 between a portion that is within the $p^-$-type isolation region 53 (on chip center side of the $p^-$-type isolation region 53) where the Vs potential region 81, the H-VDD potential region 82, the third high-concentration region 54, and the pads are disposed and a portion that is outside the $p^-$-type isolation region 53 (on chip perimeter side of the $p^-$-type isolation region 53). As a result, holes can be prevented from being injected into the inner portion of the n-type well region 3 surrounded by the $p^-$-type isolation region 53. The $p^-$-type isolation region 53 may be disposed as close as possible to an interface with the $n^-$-type well region 4 in the n-type well region 3. The reason is that the region surrounded by the $p^-$-type isolation region 53 and substantially without the injection of holes, i.e., the region where the Vs potential region 81, the H-VDD potential region 82, etc. are disposed, can be ensured to be as large as possible.

The second high-concentration regions 51 are selectively disposed in the n-type well region 3, outside the $p^-$-type isolation region 53, along the perimeter of the $p^-$-type isolation region 53 (i.e., the perimeter of the n-type well region 3). The second high-concentration regions 51 do not contact the $p^-$-type isolation region 53. For example, the second high-concentration regions 51 are arranged away from each other along the respective sides 13a to 13d of the perimeter of the n-type well region 3 and are not disposed at the corner portions of the n-type well region 3. On the second high-concentration regions 51, the second pickup electrodes 52 are respectively disposed along the second high-concentration regions 51. Similar to the second pickup electrode of the conventional HVIC, the second pickup electrodes 52 are connected to the H-VDD pad.

Two $n^+$-type drain regions 142a, 142b disposed along the first side 13a of the perimeter of the n-type well region 3 are $n^+$-type drain regions of the setting and resetting n-channel MOSFETs 211 both having the $n^-$-type well region 4 as a drift region and making up the level-up circuit 210. These two $n^+$-type drain regions 142a, 142b disposed along the first side 13a of the perimeter of the n-type well region 3 are respectively connected via level shift resistors 212a, 212b to the second high-concentration regions 51 disposed along the third and fourth sides 13c, 13d continuous with the first side 13a of the perimeter of the n-type well region 3.

The level shift resistors 212 (212a, 212b) are internal resistivity made up of portions of the n-type well region 3 interposed between the $n^+$-type drain regions 142 and the second high-concentration regions 51 disposed along the third and fourth sides 13c, 13d of the perimeter of the n-type well region 3. On the $n^+$-type drain regions 142a, 142b, drain electrodes 146a, 146b are respectively disposed along the $n^+$-type drain regions 142a, 142b. Similar to the conventional drain electrode 146, the drain electrodes 146a, 146b are connected to the output unit 215. Similar to the conventional $n^+$-type source region 141 (not depicted), the source region of the n-channel MOSFET 211 is formed inside the p-type well region 5. A level shifter circuit operation is performed by turning on the n-channel MOSFET 211 and flowing current through the level shift resistors 212 (212a, 212b) to reduce the voltage of the output unit 215. The level shift resistors 212 are not limited to the internal resistivity and may be other resistive elements, for example, a polysilicon layer formed via an insulating film on the n-type well region 3.

The $n^-$-type well region 4 contacts the n-type well region 3 and is disposed to surround the periphery of the n-type well region 3. The p-type well region 5 is the common potential region and, is disposed to contact and surround the periphery of the $n^-$-type well region 4. The p-type contact region (the first high-concentration region) 143 is annularly disposed in the p-type well region 5 along the periphery of the $n^-$-type well region 4. The first pickup electrode 145 is annularly disposed on the first high-concentration region 143 along the first high-concentration region 143. The first pickup electrode 145 is connected to the GND. The $n^+$-type source region 141 of the n-channel MOSFET 211 is connected to the first pickup electrode 145.

In FIG. 1, the first and second pickup electrodes 145, 52 are simplified and black squares indicate portions of the first and second pickup electrodes 145, 52 that are deposited on an interlayer insulating film and a protective film (not depicted) covering a chip front surface and that are embedded in contact holes. Therefore, the black squares representing the first and second pickup electrodes 145, 52 are contacts (electric contact portions) with the first and second high-concentration regions 143, 51, respectively. Instead of disposing the multiple contacts at which the first and second pickup electrodes 145, 52 partially contacts the first and second high-concentration regions 143, 51, belt-shaped contacts extending along the first and second high-concentration regions 143, 51 may be disposed.

The HVJT 21 is made up of the first and second high-concentration regions 143, 51, the $p^-$-type isolation region 53, and a portion interposed between the second high-concentration region 51 and the third high-concentration region 54 (a portion interposed between the second high-concentration region 51 and the $p^-$-type isolation region 53, in a portion without the third high-concentration region 54). Therefore, the HVJT 21 is made up of the first and second high-concentration regions 143, 51, the n⁻-type well region 4, and a portion of the p-type well region 5 farther on the chip center side than the first high-concentration region 143.

Figure 11:
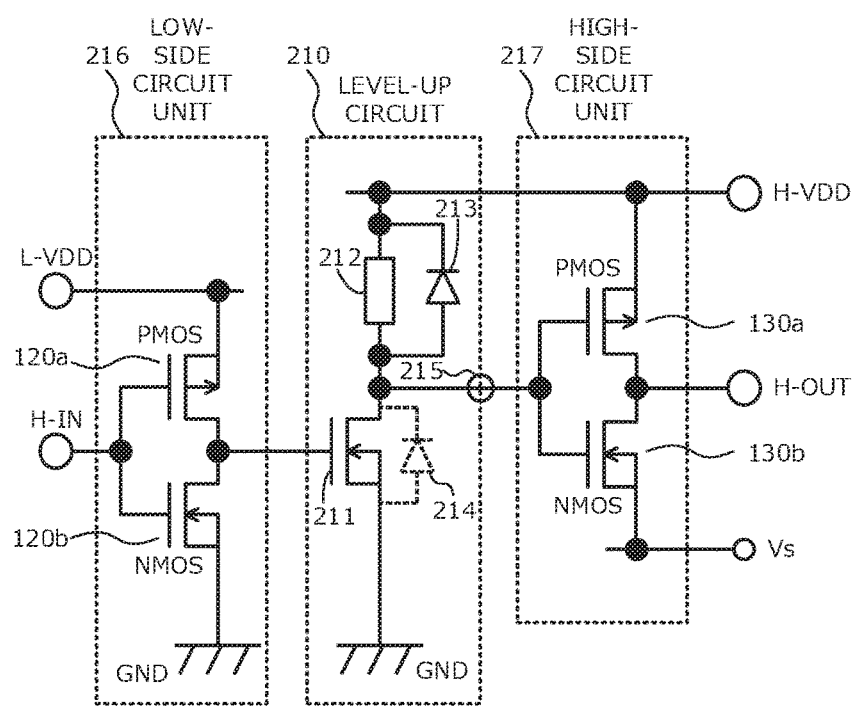
FIG. 11 is a circuit diagram of a level-up circuit.
Figure 12:
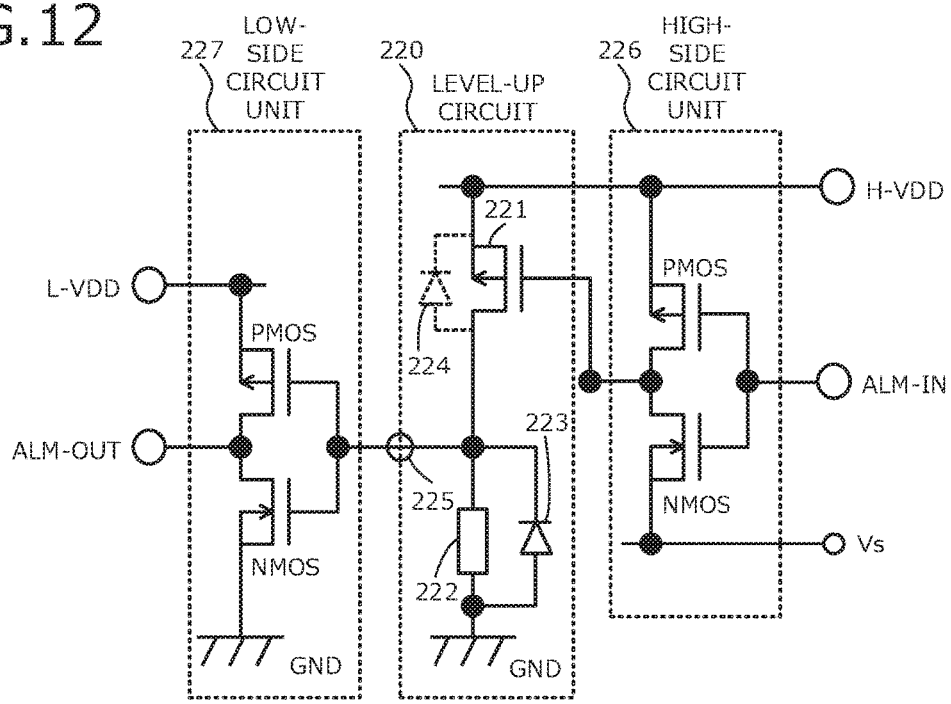
FIG. 12 is a circuit diagram of a level-down circuit.

FIG. 1 depicts the n⁺-type drain regions 142 (142a, 142b), the gate electrodes (denoted by reference numerals 144a, 144b), and the level shift resistors 212 (212a, 212b) of the n-channel MOSFET 211 of the level-up circuit 210 of FIG. 11. In the HVJT 21, each of the setting and resetting n-channel MOSFETs 211 are disposed. The n⁺-type drain regions 142a, 142b of the setting and resetting n-channel MOSFETs 211 are disposed on the n⁻-type well region 4.

On the n⁻-type well region 4 and the p-type well region 5, the gate electrodes 144a, 144b are disposed that receive input of set and reset signals. The gate electrodes 144a, 144b are disposed, via an insulating film (not depicted), on the surface of the p-type well region 5 and face the n⁺-type drain regions 142a, 142b, respectively.

The n⁻-type well region 2 is the low potential region and is disposed to contact and surround the periphery of the p-type well region 5. In the n⁻-type well region 2, a logic unit (not depicted) of the low-side circuit unit 216 of the level up circuit 210, the GND pad, the H-IN pad, the L-VDD pad, etc. are disposed. A region indicated by a thinner broken line than the bold broken lines surrounding the pads (bold broken line surrounding the second high-concentration regions 51 and the H-VDD pad) is a wiring layer connecting the pickup electrodes 52 and the H-VDD pad.

Description will be made of the cross-sectional structure along cut line A-A' crossing the p-type well region 5, the n⁻-type well region 4, and a portion of the fourth side 13d of the perimeter of the n-type well region 3 of the HVIC 50. As depicted in FIG. 2, the HVIC 50 according to the first embodiment has the n⁻-type well regions 2, 4, the n-type well region 3, and the p-type well region 5 each selectively disposed in the arrangement described above on a surface layer of a front surface of the p-type semiconductor substrate (semiconductor chip) 1 connected to the GND. The impurity concentration of the p-type semiconductor substrate 1 may be about $2.0 \times 10^{13}/cm^3$ to $1.0 \times 10^{15}/cm^3$. The impurity concentration of the p-type well region 5 may be about $2.0 \times 10^{15}/cm^3$ to $5.0 \times 10^{18}/cm^3$.

On substrate front surface side of the n-type well region 3, the Vs potential region 81 making up the high-side circuit unit 217 and the H-VDD potential region 82 (not depicted) are disposed. On the surface layer of the substrate front surface side of the n-type well region 3, the second high-concentration region 51 is selectively disposed outside the Vs potential region 81 (on a n⁻-type well region 4 side, i.e., a chip perimeter side of the Vs potential region 81). In the n-type well region 3, the p⁻-type isolation region 53 is also disposed penetrating the n-type well region 3 from the substrate front surface and reaching a remaining portion of the p-type semiconductor substrate 1 (a portion of the p-type semiconductor substrate 1, on the back surface side without the n⁻-type well regions 2, 4 and the n-type well region 3). The p⁻-type isolation region 53 is disposed between the Vs potential region 81 and the second high-concentration regions 51.

A width (width in a direction from the chip center side to the chip perimeter side) w1 of the p⁻-type isolation region 53 is a width by which breakdown voltage characteristics are maintained even when the potential of the H-VDD pad suddenly rises to a high potential of about 1200 V. For example, the width w1 of the p⁻-type isolation region 53 may be set such that depletion layers respectively extending from a pn junction (on the chip center side) with the n-type well region 3 on the inside of the p⁻-type isolation region 53 and a pn junction (on the chip perimeter side) with the n-type well region 3 on the outside of the p⁻-type isolation region 53 contact each other inside the p⁻-type isolation region 53. Therefore, the width w1 of the p⁻-type isolation region 53 is set such that the p⁻-type isolation region 53 is depleted. In particular, the width w1 of the p⁻-type isolation region 53 may be about 10 μm to 30 μm, for example.

The p-type well region 5 is disposed to contact the remaining portion of the p-type semiconductor substrate 1. The p-type well region 5 is electrically connected to the GND via the first high-concentration region 143 and the first pickup electrode 145 and is a fixed potential region that fixes the potential of the p-type semiconductor substrate 1 at the GND potential. Therefore, the p-type well region 5 acts as a self-isolation region electrically isolating the n⁻-type well region 2 from the n-type well region 3 and the n⁻-type well regions 4. The p-type well region 5 may be disposed in one continuous n-type well region (epitaxial layer) provided instead of the n⁻-type well regions 2, 4, on the side closer to the n-type well region 3 relative to the region where the low-side circuit unit 216 is disposed, such that the p-type well region 5 is away from the n-type well region 3 and penetrates the n⁻-type well region from the substrate front surface in the depth direction to contact the remaining portion of the p-type semiconductor substrate 1.

The first high-concentration region 143 is selectively disposed on the surface layer on the substrate front surface side of the p-type well region 5. A field oxide film 8 such as local oxidation of silicon (LOCS) is disposed on the substrate front surface in addition to the portions provided with contacts with electrodes such as the first and second high-concentration regions 143, 51. On the field oxide film 8, an interlayer insulating film 6 is disposed to cover the substrate front surface. The first pickup electrode 145 is in an ohmic contact with the first high-concentration region 143 via a contact hole penetrating the interlayer insulating film 6 in the depth direction (substrate depth direction). The second pickup electrode 52 is in an ohmic contact with the second high-concentration regions 51 via a contact hole penetrating the interlayer insulating film 6 in the depth direction (substrate depth direction). On the interlayer insulating film 6, a protective layer 7 is disposed to cover the first and second pickup electrodes 145, 52.

A method of manufacturing the HVIC 50 according to the first embodiment will be described with reference to FIG. 2. Description will be made of a method of forming the n⁻-type well regions 2, 4, the n-type well region 3, the p-type well region 5, the p⁻-type isolation region 53, the first and second high-concentration regions 143, 51, the n⁺-type source region 141, the n⁺-type drain regions 142 (142a, 142b), and the first and second pickup electrodes 145, 52. Although a method of forming the other constituent units of the HVIC 50 (e.g., the high-side circuit unit 217, the low-side circuit unit 216, and the constituent units of the level shifter circuit etc.) will not be described, these constituent units may be formed on a substrate with a usual method at a predetermined timing. First, photolithography and ion implantation are repeatedly performed multiple times to selectively introduce respective impurities for forming the n⁻-type well regions 2, 4, and the n-type well region 3. The impurity for forming the n⁻-type well regions 2, 4, and the n-type well region 3 is phosphorus (P), for example.

The n⁻-type well regions 2, 4, may be formed at the same time by one ion implantation, for example. The order of formation of the n⁻-type well regions 2, 4, and the n-type well region 3 may be changed variously. Subsequently, for example, heat treatment is performed at a high temperature (about 1100 to 1200 degrees C.) to diffuse the introduced impurities to a predetermined depth and thereby, form the n⁻-type well regions 2, 4, and the n-type well region 3. This heat treatment may be performed for each ion implantation for forming the n⁻-type well regions 2, 4, and the n-type well region 3. Photolithography and ion implantation are then performed to selectively introduce impurities for forming the p-type well region 5 into the surface layer of the front surface of the p-type semiconductor substrate 1. The impurity for forming the p-type well region 5 is boron (B), for example. Subsequently, for example, heat treatment is performed at high temperature (about 1100 to 1200 degrees C.) to diffuse the introduced impurities to a predetermined depth, thereby forming the p-type well region 5.

Photolithography and ion implantation are then performed to selectively introduce into the surface of the n-type well region 3, impurities for forming the p⁻-type isolation region 53. For example, a photomask or a nitride film mask opened at a portion corresponding to a formation region of the p⁻-type isolation region 53 is used to ion implant boron into a portion in which the n-type well region 3 is not formed (i.e., a portion in which the ion implantation of phosphorus is not performed for forming the n-type well region 3). Subsequently, heat treatment is performed to diffuse the introduced impurities to a predetermined depth, whereby the p⁻-type isolation region 53 is formed. The p⁻-type isolation region 53 may be formed together with the p-type well region 5 at the same time by one ion implantation, for example. Photolithography and ion implantation of arsenic (As) are then performed to selectively introduce into the surface layer of the n-type well region 3, impurities for forming the second high-concentration regions 51 that is the n⁺-type contact region, the n⁺-type source region 141, and the n⁺-type drain region 142.

Subsequently, for example, heat treatment is performed at a temperature of about 750 to 900 degrees C. to diffuse the introduced impurities to a predetermined depth, whereby the second high-concentration regions 51, the n⁺-type source region 141, and the n⁺-type drain region 142 are formed. The surface impurity concentration of the second high-concentration regions 51, the n⁺-type source region 141, and the n⁺-type drain region 142 may be about $1 \times 10^{20}/cm^3$. Photolithography and ion implantation of boron fluoride (BF₂) are then performed to selectively introduce into the surface layer of the p-type well region 5, impurities for forming the first high-concentration region 143 that is the p⁺-type contact region. Subsequently, for example, heat treatment is performed at a temperature of about 750 to 900 degrees C. to diffuse the introduced impurities to a predetermined depth, whereby the first high-concentration region 143 is formed. The surface impurity concentration of the first high-concentration region 143 may be about $1 \times 10^{20}/cm^3$. Usual methods are then used for forming the field oxide film 8, the interlayer insulating film 6, and the contact holes and for sputtering for depositing a metal layer making up metal electrodes, whereby the first and second pickup electrodes 145, 52 are formed by the metal layer embedded in the contact holes. Subsequently, the protective layer 7 such as a passivation film covering the substrate front surface is formed by a usual method to complete the HVIC 50 depicted in FIG. 1.

Carrier (electrons and holes) behavior when negative surge voltage occurs will be described with reference to FIG. 2. The occurrence of the negative surge voltage is a case where, for example, the potential of the Vs terminal 111 drops in the negative direction and transiently makes the potentials lower than the GND potential in the n-type well region 3 disposed where the high-side circuit unit 217 connected to the H-VDD and the n⁻-type well region 4 making up the HVJT 21 are disposed. As depicted in FIG. 2, a parasitic pn diode 31 is formed in the HVIC 50 with the second high-concentration region 51 that is the n⁺-type contact region used as a cathode, the first high-concentration region 143 that is the p⁺-type contact region (and the p-type well region 5) used as an anode, and the n⁻-type well region 4 between the cathode and the anode used as a drift. In current flowing through the parasitic pn diode 31 (flow of carriers), the holes are injected from the first high-concentration region 143 into the second high-concentration region 51 connected to the second pickup electrode 52 at the potential of the H-VDD. On the other hand, the electrons flowing through the parasitic pn diode 31 are injected from the second high-concentration region 51 via the n⁻-type well region 4 into the first high-concentration region 143 (and the p-type well region 5) connected to the first pickup electrode 145 at the GND potential. The p⁻-type isolation region 53 disposed on the chip center side of the second high-concentration region 51 achieves junction isolation in the n-type well region 3 between a portion on the chip center side and where the high-side circuit unit 217 made up of the Vs potential region 81, the H-VDD potential region 82, etc. is disposed and a portion on the chip perimeter side (on the breakdown voltage side) and where the second high-concentration region 51 is disposed. As a result, since the p⁻-type isolation region 53 acts as a potential barrier when negative surge voltage occurs, the current (holes) flowing through the parasitic pn diode 31 formed outside the p⁻-type isolation region 53 becomes dominant (an arrow denoted by reference numeral 32). Therefore, almost no holes flow into the Vs potential region 81 and the H-VDD potential region 82 disposed on the chip center side of the p⁻-type isolation region 53 (a dotted arrow with a cross mark denoted by reference numeral 33). Thus, malfunction and destruction can be prevented in the logic unit of the high-side circuit unit 217.

The flow of carriers (mainly holes) from the p-type well region 5 to the n-type well region 3 when negative surge voltage occurs will be described in more detail with reference to FIGS. 2 and 3. FIG. 3 is an explanatory view of carrier behavior when negative surge voltage is applied to the high-voltage integrated circuit device of FIG. 1. In FIG. 3, arrows from the p-type well region 5 to the second high-concentration regions 51 indicate the flow 32 of the holes becoming dominant due to the parasitic pn diode 31 depicted in FIG. 2. Diodes depicted on the p-type well region 5 and the n⁻-type well region 4 correspond to the parasitic pn diode 31 of FIG. 2. An arrow with a cross mark represents a state in which the flow 33 of holes from the n⁻-type well region 4 to the Vs potential region 81 is suppressed by the p⁻-type isolation region 53 acting as the potential barrier as depicted in FIG. 2.

As depicted in FIGS. 2A, 2B, and 3, if the negative surge voltage is input via each of the Vs and H-VDD of the HVIC 50 to the first pickup electrode 145 and the second pickup electrode 52, the parasitic pn diode 31 is forward-biased and the holes flow toward the n-type well region 3 disposed with the high-side circuit unit 217 such as the Vs potential region 81 while the electrons flow toward the p-type well region 5 (the first high-concentration region 143). In this case, the holes flowing into the n-type well region 3 do not flow into the chip center side of the n-type well region 3 junction-isolated by the p⁻-type isolation region 53 (the arrow with a cross mark denoted by reference numeral 33) and actively flow into a vicinity of the H-OUT pad, the Vs pad, and the GND pad (hereinafter, parasitic pn diode region) surrounded by broken lines in FIG. 3 and flow into the second pickup electrode 52 at the potential of the H-VDD (the arrow denoted by reference numeral 32). As a result, the holes can be restrained from flowing into the Vs potential region 81 disposed on the chip center side of the p⁻-type isolation region 53.

As described above, according to the first embodiment, by disposing the p⁻-type isolation region to surround the logic unit of the high-side circuit unit made up of the regions arranged in the Vs potential region, the H-VDD potential region, etc. to isolate the logic unit of the high-side circuit unit from the breakdown voltage region and by disposing the second high-concentration region and the second pickup electrode 52 fixed to the potential of the H-VDD on the chip perimeter side (the breakdown voltage side) of the p⁻-type isolation region, the current (holes) flowing into the second pickup electrode becomes predominant, and the hole injection amount into the Vs potential region can be reduced even when negative surge voltage occurs. According to the first embodiment, since the current (holes) flowing into the second pickup electrode becomes predominant, a reduction can be achieved in the hole injection amount flowing into the drain of the n-channel MOSFET making up the level-up circuit disposed in the HVJT. Therefore, even when a reduction in size is achieved to the extent that a facing position is generated with a narrow distance between the HVJT and the Vs potential region where the high-side circuit unit is disposed, malfunction (incorrect signal transfer) or destruction due to latch-up can be mitigated in the logic unit of the high-side circuit unit. Therefore, the HVIC can be provided that prevents malfunction or destruction from occurring due to negative surge voltage in the logic unit of the high-side circuit unit.

A structure of a semiconductor integrated circuit device according to a second embodiment will be described. FIGS. 4A and 4B are cross-sectional views of a main portion of a high-voltage integrated circuit device according to the second embodiment. FIGS. 5A and 5B are cross-sectional views of a main portion of another example of the high-voltage integrated circuit device according to the second embodiment. The HVIC according to the second embodiment differs from the HVIC according to the first embodiment in that the p⁻-type isolation region 53 is disposed to contact the n⁻-type well region 4. For example, as depicted in FIG. 4A, the p⁻-type isolation region 53 may be disposed between the n-type well region 3 and the n⁻-type well region 4 so as to contact the n-type well region 3 and the n⁻-type well region 4. Instead of the p⁻-type isolation region 53, as depicted in FIG. 4B, a p-type isolation region 153 may be formed by forming the n-type well region 3 and the n⁻-type well region 4 without contact such that the p-type semiconductor substrate 1 is exposed on the surface. Alternatively, as depicted in FIGS. 5A and 5B, the p⁻-type isolation region 53 may be formed to penetrate the n⁻-type well region 4 from the substrate front surface to the remaining portion of the p-type semiconductor substrate 1 such that the p⁻-type isolation region 53 is interposed between the n⁻-type well regions 4 located on the chip center side and the chip perimeter side.

In this case, the n⁺-type drain regions 142 of the re-channel MOSFET 211 making up the level-up circuit 210 and the second high-concentration regions 51 disposed along the chip perimeter side of the p⁻-type isolation region 53 are disposed in the n⁻-type well regions 4. The level shift resistors 212 are made up of portions of the n⁻-type well regions 4 interposed between the n⁺-type drain regions 142 and the second high-concentration regions 51 facing the n⁺-type drain regions 142. As a result, the level shifter circuit operation of the HVIC according to the second embodiment can be performed as in the first embodiment. The width of the p⁻-type isolation region 53 may be set such depletion layers respectively extending from a pn junction (on the chip center side) with the n-type well region 3 and a pn junction (on the chip perimeter side) with the n⁻-type well regions 4 contact in the p⁻-type isolation region 53. Although the p-type isolation region 153 is formed between the n-type well region 3 and the n⁻-type well region 4 in the example depicted in FIG. 4B, the n-type well region 3 or the n⁻-type well region 4 may be formed such that the region is separated into multiple sections.

As described above, the second embodiment achieves effects identical to those of the first embodiment.

A structure of a semiconductor integrated circuit device according to a third embodiment will be described. FIG. 6 is a cross-sectional view of a main portion of a high-voltage integrated circuit device according to the third embodiment. An HVIC 60 according to the third embodiment differs from the HVIC according to the first embodiment in that p⁻-type isolation regions (isolation regions) 63 are disposed to achieve the junction isolation inside the n⁻-type well region 4 acting as the breakdown voltage region. For example, the p⁻-type isolation regions 63 achieve the junction isolation of the n-channel MOSFETs 211 on the setting and resetting sides from the Vs potential region 81 and the H-VDD potential region 82. The planar layout of the p⁻-type isolation regions 63 will hereinafter be described for a case of disposing three approximately U-shaped p⁻-type isolation regions 63 (hereinafter, first to third p⁻-type isolation regions 63a to 63c) forming an annular shape contacting the p-type well region 5.

The first and second p⁻-type isolation regions 63a, 63b respectively achieve the junction isolation of the n-channel MOSFETs 211 and the second high-concentration regions 51 facing the n-channel MOSFETs 211 from the Vs potential region 81 and the H-VDD potential region 82. For example, the first p⁻-type isolation region 63a is disposed in an approximately U-shape surrounding the setting n-channel MOSFET 211 and both end portions of the first p⁻-type isolation region 63a the n⁻-type well region 4 contact with the p-type well region 5. The second p⁻-type isolation region 63b is disposed in an approximately U-shape as with the first p⁻-type isolation region 63a and contacts the p-type well region 5 to surround the resetting n-channel MOSFET 211.

The third p⁻-type isolation region 63c achieves junction isolation of the second high-concentration regions 51 disposed along the sides 13b to 13d of the perimeter of the n-type well region 3 from the Vs potential region 81 and the H-VDD potential region 82. For example, the third p⁻-type isolation region 63c is disposed in an approximately U-shape surrounding the second high-concentration regions 51, passing between the second high-concentration regions 51 disposed along the three sides 13b to 13d of the perimeter of the n-type well region 3 and each of the third high-concentration region 54, the Vs potential region 81, and H-VDD potential region 82, and both end portions of the third p⁻-type isolation region 63c cross the n⁻-type well region 4 and contact the p-type well region 5. Therefore, the third p⁻-type isolation region 63c contacts the p-type well region 5 to surround the second high-concentration regions 51 disposed along the sides 13b to 13d of the perimeter of the n-type well region 3.

The width of the p⁻-type isolation regions 63 is set to a width that maintains breakdown voltage characteristics even when the potential of the H-VDD pad suddenly rises to a high potential of about 600 V. For example, the width of the p⁻-type isolation regions 63 may be set such that depletion layers respectively extending from a pn junction (on the chip center side) with the n-type region (the n-type well region 3 or the n⁻-type well region 4) on the chip center side of the p⁻-type isolation regions 63 and a pn junction (on the chip perimeter side) with the n-type region on the chip perimeter side of the p⁻-type isolation regions 63 contact in the p⁻-type isolation regions 63. Therefore, the width of the p⁻-type isolation regions 63 is set such that the p⁻-type isolation regions 63 are depleted. In particular, the width of the p⁻-type isolation regions 63 may be about 10 µm to 20 µm, for example.

In the third embodiment, since the p⁻-type isolation regions 63 achieve the junction isolation of the second high-concentration regions 51 disposed along the first side 13a of the perimeter of the n-type well region 3 from the second high-concentration regions 51 disposed along the sides 13c, 13d of the perimeter of the n-type well region 3, the level shift resistors 212a, 212b made up of the internal resistivity of the n-type well region 3 cannot be formed. Therefore, for example, a polysilicon resistor disposed via the insulating film on the substrate (the n-type well region 3) is used for connecting the n⁺-type drain regions 142 (142a, 142b) of the n-channel MOSFETs 211 to the H-VDD pad or the third high-concentration region 54. As a result, the level shifter circuit operation can be performed as is with the first embodiment.

As described, the third embodiment can produce effects identical to those of the first and second embodiments.

A structure of a semiconductor integrated circuit device according to a fourth embodiment will be described. FIG. 7 is a cross-sectional view of a main portion of a high-voltage integrated circuit device according to the fourth embodiment. FIG. 8 is a cross-sectional view along cut line B-B' in FIG. 7. An HVIC 70 according to the fourth embodiment differs from the HVIC according to the first embodiment in that, instead of the p⁻-type isolation region achieving the junction isolation inside the n-type well region 3, a dielectric region (isolation region) 73 achieves dielectric isolation inside the n-type well region 3. The dielectric region 73 is formed by embedding a typical dielectric material film 72, for example, an oxide film (SiO₂), inside a trench 71 deeper than the depth of the n-type well region 3, for example.

The dielectric region 73 is annularly disposed along the perimeter of the n-type well region 3 as with the first embodiment to achieve the junction isolation between a portion on the inside of the n-type well region 3 (the chip center side) and a portion outside the p⁻-type isolation region 53 (the chip perimeter side). To form the dielectric region 73, for example, after forming the n-type well region 3, the trench 71 may be formed to penetrate the n-type well region 3 from the substrate front surface to the remaining portion of the p-type semiconductor substrate 1 and the dielectric material film 72 may then be embedded inside the trench 71.

Alternately, the second embodiment may be applied such that the dielectric region 73 is disposed between the n-type well region 3 and the n⁻-type well region 4 so as to contact the n-type well region 3 and the n⁻-type well region 4. The trench 71 may be formed to penetrate the n⁻-type well region 4 from the substrate front surface to the remaining portion of the p-type semiconductor substrate 1 and the dielectric material film 72 may be embedded such that the dielectric region 73 is interposed between the n⁻-type well regions 4 located on the chip center side and the chip perimeter side.

Even when the fourth embodiment is applied to the second or third embodiment described above such that the dielectric region 73 is disposed instead of the p⁻-type isolation region, effects identical to those of the fourth embodiment are achieved.

As described above, the fourth embodiment achieves effects identical to those of the first to third embodiments.

A structure of a semiconductor integrated circuit device according to a fifth embodiment will be described. An HVIC according to the fifth embodiment differs from the HVIC according to the first embodiment in that, instead of the high-potential region, the low-potential region, and the n-type regions (the n-type well region 3 and the n⁻-type well regions 2, 4 of FIG. 1) making up the HVJT, the HVIC is constructed by using an epitaxial substrate (semiconductor chip) formed by stacking an n-type epitaxial growth layer on the p-type semiconductor substrate 1 or an embedded epitaxial substrate made up of a p⁻-type epitaxial layer and an embedded n⁺-type semiconductor layer. In this case, the p-type well region 5 may be disposed to penetrate the n-type epitaxial growth layer to a depth reaching an underlying p-type semiconductor layer (the p-type semiconductor substrate 1 or the p-type epitaxial layer).

FIGS. 9A and 9B are cross-sectional views of a main portion of a high-voltage integrated circuit device according to the fifth embodiment. In an example of an embedded epitaxial growth substrate of FIGS. 9A and 9B, after introducing into the surface of the p-type semiconductor substrate 1, impurities for forming an n⁺-type embedded layer 3a, an epitaxial layer 4a is stacked on the p-type semiconductor substrate 1, and an n-type well region 3b formed by a layer diffused from the surface of the epitaxial layer 4a is formed on the n⁺-type embedded layer 3a. A p⁻-type isolation region 83 is made of a diffusion layer extending from the surface of the epitaxial layer 4a to the p-type semiconductor substrate 1.

Even when the fifth embodiment is applied to the second or fourth embodiment described above to use the epitaxial substrate or the embedded epitaxial substrate, effects identical to those of the fifth embodiment are achieved.

As described, the fifth embodiment achieves effects identical to those of the first to fourth embodiments.

The present invention is not limited to the embodiments described above and is applicable to various integrated circuits having a parasitic pn junction unit (parasitic pn diode) formed between a high-side circuit unit and an HVJT. The present invention is applicable even when the conductive types (the n and p types) of the semiconductor layers or semiconductor regions are reversed.

As a result of intensive study, the present inventor found that the conventional HVICs have the following problems. Description will be made of a case where in a power conversion device formed by connecting the switching power devices (the IGBTs 114, 115) and the HVIC depicted in FIG. 10, the high-potential-side Vss of the high-voltage power source (main circuit power source) is about 1200 V while the potential of the H-VDD of the HVIC is higher by about 15 V than the potential of the Vs. While the upper-arm IGBT 115 of the half bridge circuit is turned on and the lower-arm IGBT 114 is turned off, current flows from the upper-arm IGBT 115 to the L-load 118.

When the upper-arm IGBT 115 is shifted from this state to an off-state, the L-load 118 attempts to maintain the current flowing through the power conversion apparatus (a current phase is delayed by the L-load 118 relative to AC voltage) and therefore, current flows from the GND via the FWD 116 connected in parallel with the lower-arm IGBT 114 to the L-load 118. This reduces the potential of the Vs terminal 111 lower than the GND potential to about −30 V, for example. If the potential of the Vs terminal 111 is reduced to about −30 V, the potential of the H-VDD is higher than the potential of the Vs by about 15 V as described above and is therefore about −15 V (=−30 V+15 V).

In the structure of the conventional HVIC 200 depicted in FIGS. 13 and 14, the p-type semiconductor substrate 101 and the p-type well region 105 are at the GND potential. Therefore, if the potential of the Vs terminal 111 is reduced until the potentials become lower than the GND potential in both the n-type well region 103 and the n⁻-type well region 104 making up the CMOS circuit of the logic unit of the high-side circuit unit 217 of the level-up circuit 210, the parasitic pn diodes 171, 172 are forward-biased and large current flows. This current is input through the n-type well region 103 from the high-side circuit unit 217 to the IGBT 115 and flows via a gate-emitter capacitance to the L-load 118. Since this current path (path) has no resistance component limiting the current, an extremely large pulse current is generated. This pulse current causes destruction or malfunction of the HVIC 200.

In the planar structure of the conventional HVIC 200, if negative surge voltage is applied to the Vs pad (the Vs terminal 111) or the H-VDD pad, holes are injected from the p-type well region 105 making up an anode of the parasitic pn diode 172 to the n⁻-type well region 104 making up a cathode. Particularly, at the facing position 185 of the HVJT 201 having a short distance from the Vs potential region 181, the resistance of the n⁻-type well region 104 interposed between the Vs potential region 181 and the p-type well region 105 (the cathode resistance of the parasitic pn diode 172) becomes smaller as compared to the other positions of the n⁻-type well region 104. Therefore, at the facing position 185 of the HVJT 201 having a short distance from the Vs potential region 181, the hole injection amount from the p-type well region 105 to the n⁻-type well region 104 is larger as compared to the other positions of the n⁻-type well region 104.

The holes entering the n⁻-type well region 104 flow through immediately below the second high-concentration region 151 toward the p-type offset region 131 and the p⁺-type drain region 134 corresponding to the Vs potential region 181 at a negative potential relative to the GND potential. The holes entering the p-type offset region 131 are extracted from the p⁺-type contact region 138 by the Vs terminal 111. However, some of the holes entering the p-type offset region 131 flow into the n⁺-type source region 137 immediately below and form a gate current of a parasitic npn transistor made up of the n⁺-type source region 137, the p-type offset region 131, and the n-type well region 103. Therefore, this parasitic npn transistor may be turned on and cause malfunction of the logic unit of the high-side circuit unit 217.

Moreover, the holes flowing into the n⁺-type source region 137 immediately below may turn on (latch up) a parasitic thyristor made up of the n⁺-type source region 137, the p-type offset region 131, and the n-type well region 103, leading to destruction of the high-side circuit unit 217. If some of the holes entering the p-type offset region 131 flow through the n-type well region 103 to the p⁺-type drain region 134, the high-side circuit unit 217 may malfunction. The parasitic pn diode 171 has high anode resistance because of high specific resistance of the p-type semiconductor substrate 101 acting as an anode. Therefore, a trace amount of holes is injected from the p-type semiconductor substrate 101 to the n-type well region 103.

With regard to the occurrence of malfunction and destruction due to parasitic operations, the level of current is suppressed in Japanese Patent No. 3346763 by connecting a resistor limiting current between a substrate and a ground terminal; however, no description is provided in terms of connecting a resistor at the other positions. Additionally, since this resistor is made of a polysilicon layer, if a large pulse current (several A to several tens of A) due to the negative surge voltage transiently flows though the parasitic diode between the Vs terminal and the ground terminal, the polysilicon layer making up the resistor may melt consequent to the heat accompanying the overcurrent and may be destroyed.

Japanese Laid-Open Patent Publication No. 2001-25235 does not describe a resistor or a layout for limiting the currents of the body diode of the MOSFET making up the level shifter circuit and the parasitic pn diode of the HVIC if the potential of the H-VDD becomes negative due to the L-load. Japanese Laid-Open Patent Publication No. 2008-301160 does not describe prevention of malfunction (incorrect inversion) due to a parasitic operation of a high-side circuit unit using the potential of the Vs terminal as a reference.

Japanese Laid-Open Patent Publication No. 2010-263116 does not describe disposing a high-voltage diode between a bootstrap power source potential (H-VDD potential) node (potential point) and the substrate region having the common ground potential (GND potential). The technique described in WO 2012/176347 cannot produce the effect of preventing malfunction and destruction of the high-side circuit since a large amount of carriers is injected also into the Vs potential region when the negative surge voltage is high or the negative surge voltage is applied for a long period. Therefore, the effect is limited.

In the technique described in Japanese Patent No. 3917211, a high-voltage n-channel RESURF MOSFET making up a level shifter circuit is disposed in an n-type diffusion layer making up the HVJT and this n-type diffusion layer corresponds to a drain drift region or a drain region. Therefore, the negative surge voltage injects holes (current) from the n-type diffusion layer making up the HVJT into the level shifter circuit, leading to destruction by the heat generated by overcurrent in internal devices, wirings, etc. of the level shifter circuit, or excessive injection of holes may make the potential of a drain node (a drain potential point of the high-voltage n-channel RESURF MOSFET) unstable, resulting in malfunction of the level shifter circuit.

According to the invention described above, if the second potential drops in the negative direction and potentials transiently become lower than the first potential (lowest potential) in a predetermined region disposed with the second circuit on the high side and the second well region of the second conductivity type making up a high-voltage junction termination region, current injection (hole carrier injection) can be caused to flow predominantly to the first electrode with respect to a parasitic pn diode having an anode that is the third well region of the first conductivity type making up the high-voltage junction termination region and a cathode that is the second well region of the second conductivity type. This enables suppression of transient injection of holes into the predetermined region of the second potential. Therefore, even when size reduction is achieved to an extent that a facing position is generated with a narrow distance between the high-voltage junction termination region and the predetermined region of the second potential, the malfunction (incorrect signal transfer) or destruction due to latch-up prevented in a logic unit of the second circuit on the high side.

The semiconductor integrated circuit device according to the present invention produces an effect that the hole injection amount due to the negative surge voltage can be reduced to prevent malfunction or destruction of the high-side circuit unit without increasing chip area.

As described, the semiconductor integrated circuit device according to the present invention is useful for a high-voltage integrated circuit device used when on/off-drive signals are transferred to a gate of a power device in a PWM inverter, a switching power source, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit device, comprising:
    a semiconductor layer of a first conductivity type;
    a first well region of a second conductivity type, disposed in the semiconductor layer at a first surface side thereof;
    a second well region of the second conductivity type, disposed in the semiconductor layer at the first surface side thereof, the second well region contacting the first well region and surrounding a periphery of the first well region, and having an impurity concentration that is lower than that of the first well region;
    a third well region of the first conductivity type, disposed in the semiconductor layer at the first surface side thereof, the third well region contacting the second well region and surrounding a periphery of the second well region;
    an isolation region electrically isolating a predetermined region in the first well region, the isolation region being in an annular shape surrounding the predetermined region;
    a first high-concentration region of the second conductivity type, disposed outside the isolation region and inside the first well region, the first high-concentration region having an impurity concentration that is higher than that of the first well region; and
    a second high-concentration region of the second conductivity type, disposed inside the isolation region and inside the first well region, the second high-concentration region having an impurity concentration that is higher than that of the first well region.

2. The semiconductor integrated circuit device according to claim 1, wherein
    the isolation region is one of a region of the first conductivity type and a dielectric region.

3. The semiconductor integrated circuit device according to claim 2, further comprising:
    a fourth well region of the second conductivity type, disposed in the semiconductor layer at the first surface side thereof and adjacent to the third well region, so that the third well is between the fourth well region and the first well region.

4. The semiconductor integrated circuit device according to claim 3, further comprising:
    a first circuit unit disposed in the fourth well region;
    a second circuit unit disposed in the first well region; and
    a third circuit unit disposed in the second well region and the third well region and connected between the first circuit unit and the second circuit unit, the third circuit unit converting a voltage level of a signal input from the first circuit unit and outputting the signal to the second circuit unit, wherein
    the second circuit unit outputs, based on the signal output from the third circuit unit, a gate signal of a high-side transistor of two serially-connected transistors.

5. The semiconductor integrated circuit device according to claim 1, further comprising:
    a fourth well region of the second conductivity type, disposed in the semiconductor layer at the first surface side thereof and adjacent to the third well region, so that the third well is between the fourth well region and the first well region.

6. The semiconductor integrated circuit device according to claim 5, further comprising:
    a first circuit unit disposed in the fourth well region;
    a second circuit unit disposed in the first well region; and
    a third circuit unit disposed in the second well region and the third well region and connected between the first circuit unit and the second circuit unit, the third circuit unit converting a voltage level of a signal input from the first circuit unit and outputting the signal to the second circuit unit, wherein
    the second circuit unit outputs, based on the signal output from the third circuit unit, a gate signal of a high-side transistor of two serially-connected transistors.

7. The semiconductor integrated circuit device according to claim 1, further comprising:
    a fourth well region of the second conductivity type, disposed in the semiconductor layer at the first surface side thereof and adjacent to the third well region, so that the third well is between the fourth well region and the first well region.

8. The semiconductor integrated circuit device according to claim 7, further comprising:
    a first circuit unit disposed in the fourth well region;
    a second circuit unit disposed in the first well region; and
    a third circuit unit disposed in the second well region and the third well region and connected between the first circuit unit and the second circuit unit, the third circuit unit converting a voltage level of a signal input from the first circuit unit and outputting the signal to the second circuit unit, wherein
    the second circuit unit outputs, based on the signal output from the third circuit unit, a gate signal of a high-side transistor of two serially-connected transistors.

9. The semiconductor integrated circuit device according to claim 1, further includes
    a first electrode in electrical contact with the first high-concentration region, and
    a second electrode in electrical contact with the second high-concentration region.

10. A semiconductor integrated circuit device, comprising:
    a semiconductor layer of a first conductivity type;
    a first well region of a second conductivity type, disposed in the semiconductor layer at a first surface side thereof;
    a second well region of the second conductivity type, disposed in the semiconductor layer at the first surface side thereof, the second well region contacting the first well region and surrounding a periphery of the first well region, and having an impurity concentration that is lower than that of the first well region;
    a third well region of the first conductivity type, disposed in the semiconductor layer at the first surface side thereof, the third well region contacting the second well region and surrounding a periphery of the second well region;

an isolation region electrically isolating a predetermined region in the first well region;

a first high-concentration region of the second conductivity type, disposed outside the isolation region and inside the first well region, the first high-concentration region having an impurity concentration that is higher than that of the first well region; and a second high-concentration region of the second conductivity type, disposed inside the isolation region and inside the first well region, the second high-concentration region having an impurity concentration that is higher than that of the first well region, wherein the isolation region passes between the predetermined region and the first high-concentration region, crosses the second well region, and reaches the third well region, and the predetermined region is electrically isolated from at least three continuous sides by the isolation region.

\* \* \* \* \*